(12) United States Patent
McCarthy

(10) Patent No.: US 11,297,738 B2
(45) Date of Patent: Apr. 5, 2022

(54) DATA CENTER COOLING SYSTEM

(71) Applicant: Equinix, Inc., Redwood City, CA (US)

(72) Inventor: Chad McCarthy, Frankfurt am Main (DE)

(73) Assignee: Equinix, Inc., Redwood City, CA (US)

( * ) Notice: Subject to any disclaimer, the term of this patent is extended or adjusted under 35 U.S.C. 154(b) by 0 days.

(21) Appl. No.: 16/911,231

(22) Filed: Jun. 24, 2020

(65) Prior Publication Data
US 2021/0105910 A1    Apr. 8, 2021

Related U.S. Application Data

(60) Provisional application No. 63/018,332, filed on Apr. 30, 2020, provisional application No. 62/909,631, filed on Oct. 2, 2019.

(51) Int. Cl.
*H05K 7/20* (2006.01)

(52) U.S. Cl.
CPC ....... *H05K 7/2079* (2013.01); *H05K 7/20154* (2013.01); *H05K 7/20745* (2013.01)

(58) Field of Classification Search
CPC .......................... H05K 7/2079; H05K 7/20745
See application file for complete search history.

(56) References Cited

U.S. PATENT DOCUMENTS 8,094,452 B1 *   1/2012   Carlson ..................... G06F 1/20
                                                        361/699
9,091,496 B2 *   7/2015   Imwalle ............. H05K 7/20836

2013/0081784 A1   4/2013   Faig Palomer
2017/0318705 A1   11/2017  Koster et al.
2019/0104636 A1 * 4/2019   Jochim ................ H05K 7/1489
2020/0106298 A1 * 4/2020   Ross ....................... H02J 13/00

FOREIGN PATENT DOCUMENTS

DE   102014116792 A1   5/2016
EP       2317236 B1    6/2015
EP       3221646 B1    1/2019
(Continued)

OTHER PUBLICATIONS

Extended Search Report from counterpart European Application No. 20192346.3, dated Feb. 15, 2021, 9 pp.
(Continued)

*Primary Examiner* — Mukundbhai G Patel
(74) *Attorney, Agent, or Firm* — Shumaker & Sieffert, P.A.

(57) ABSTRACT

This disclosure describes systems for cooling one or more data halls of a data center that include one or more sections of a cooling spine. Each section of the cooling spine includes a riser module, a manifold module, and one or more arrays of cooling units. The riser module includes riser piping configured to fluidically couple to a liquid cooling system. The manifold module includes manifold piping fluidically coupled to the riser piping. Each array of cooling units is positioned toward a data hall of the one or more data halls of the data center and includes a heat exchanger assembly and a circulation assembly. The heat exchanger assembly is fluidically coupled to the manifold piping and configured to cool return air from a hot aisle adjacent a row of cabinets. The circulation assembly is configured to discharge supply air to a cold aisle adjacent the row of cabinets.

27 Claims, 14 Drawing Sheets

(56) References Cited

FOREIGN PATENT DOCUMENTS

KR     20170084113 A    7/2017
WO    2016/079119 A1    5/2016

OTHER PUBLICATIONS

"The new flexibility of CoolW@II®—3 systems in one wall," Weiss Klimatechnik GmbH, May 3, 2018, 5 pp.
Response to Extended Search Report dated Feb. 15, 2021, from counterpart European Application No. 20192346.3, filed Oct. 7, 2021, 101 pp.

\* cited by examiner

DATA CENTER COOLING SYSTEM

RELATED APPLICATIONS

This application claims the benefit of U.S. Provisional Application No. 62/909,631, filed Oct. 2, 2019, and U.S. Provisional Application No. 63/018,332, filed Apr. 30, 2020, the entire contents of each of which being incorporated herein by reference.

TECHNICAL FIELD

This disclosure relates to cooling systems, and more specifically, to cooling systems for data centers.

BACKGROUND

Computing devices, such as servers and networking equipment, may be installed in cabinets that provide structure, security, and/or connectivity to the computing devices. These cabinets may be arranged in parallel pairs of rows with an enclosure between each pair of rows and an open space around each pair of rows. A data hall may provide bulk cooling to the cabinets through a ceiling plenum above the cabinets, a floor plenum below the cabinets, and one or more cooling and circulation devices coupled to the ceiling and floor plenums. To cool the cabinets, the cooling and circulation devices may circulate cooler supply air through the underfloor plenum to the open space, draw warmer return air from the enclosure through the ceiling plenum back to the cooling devices, and condition (e.g., cool and filter) the warmer return air. Each cabinet is cooled by receiving the cooler supply air from the open space and discharging the warmer return air to the enclosure. To increase cooling to the cabinets, the cooling and circulation systems may increase the flow or decrease the temperature of the supply air to the open space. To perform maintenance on the cooling and circulation devices, a mechanic may enter the open space to access the cooling and circulation devices.

SUMMARY

This disclosure describes scalable cooling systems for data halls of a data center. In some examples, a cooling system of one or more data halls includes a modularly-arranged cooling spine configured to cool rows of cabinets in the data halls. Each section of the cooling spine includes a riser module to supply utilities, such as cooling fluid and electrical power, to the cooling spine and to other vertically adjacent cooling spines. Each section of the cooling spine also includes a manifold module to supply utilities to cooling units within the section of the cooling spine and to other horizontally adjacent sections of the cooling spine. One or more arrays of cooling units separate the cooling spine from hot aisles and cold aisles of a data hall. These arrays of cooling units include circulation assemblies, such as fans, that discharge cooled supply air from the cooling spine directly into the cold aisles and draw warmer return air directly from the hot aisles into the cooling spine. The arrays of cooling devices include heat exchanger assemblies, such as cooling coils, that cool the warmer return air prior to entering the cooling spine.

In some examples, the cooling spine may provide cooled supply air for cooling the rows of cabinets with increased system robustness. For example, each array of cooling units may draw warmer return air from the hot aisles through heat exchanger assemblies to cool the warmer return air. However, rather than filter and discharge this cooled air directly back into an adjacent cold aisle, each array of cooling units discharges the cooled air into a volume within the cooling spine. One or more filtration units may filter the cooled air in the volume. Each array of cooling units may be configured with an additional capacity, such as an extra heat exchanger assembly and circulation assembly. If one or more cooling units of a section fails or underperforms, the extra cooling unit may compensate for the failure or underperformance.

In some examples, the cooling spine may provide cooled supply air for cooling the rows of cabinets using a relatively low pressure differential. Rather than filter return air in-line of a flow path, one or more filtration units may filter the cooled supply air in a side stream within the cooling spine. Such side stream filtering may be achieved with a lower flow rate than a flow rate for cooling the rows of cabinets, and may result in a reduced pressure drop compared to an in-line filtration unit for an equivalent level of filtration. This side stream filtration may permit a higher degree of filtration (e.g., Merv 8 to Merv 13) for a particular flow rate of cooled supply air with reduced fan power, as the cooled supply air is filtered in the cooling spine rather than throttled through a relatively-high pressure drop filtration system. Each array of cooling units may discharge the cooled supply air directly into an adjacent cold aisle and draw warmer return air directly into the cooling spine. As a result, a flow path of air through a row of cabinets may be horizontal (e.g., cold aisle to hot aisle to cooling spine), rather than vertical (e.g., underfloor plenum to cold aisle to hot aisle to overhead plenum to cooling unit), and with a corresponding reduction in pressure drop. Heat exchanger assemblies may have relatively large surface areas, and correspondingly lower air speeds, which may result in more efficient exchange of heat across coils of the heat exchanger assemblies. Lower air speeds may enable an elevated temperature of cooling liquid, which may result in lower energy costs for cooling the cooling liquid and, in some instances, lower capital costs by eliminating a chiller in the cooling liquid system. By using the cooling spine as a supply air plenum, the cooling spine may replace underfloor or overhead plenums, such that the data hall may have reduced height and/or reduced redundancy of concealed services (e.g., fire detection and suppression). In some instances, elimination and/or replacement of underfloor or overhead plenums may enable a full height of a data hall to be used for cooling, such that the cooling spine may discharge cooled supply air and receive warmer return air above the row of cabinets. As a result, the cooled supply air may have a reduced velocity past cabinets adjacent to the cooling spine and the warmer supply air may have reduced velocity through the heat exchange assemblies due to the larger surface area.

In some examples, the cooling spine may provide customized cooling to particular rows of cabinets within a data hall of a data center. For example, each array of cooling units may discharge cooled supply air to one or more cold aisles adjacent to a corresponding row of cabinets. The array of cooling units may control the flow of air to, and thus the temperature differential across, the rows of cabinets to increase or decrease cooling to the rows of cabinets, such that different rows of cabinets may receive different amounts of cooling using a same source (the cooling spine) of cooled supply air. As a result, fan power may be reduced in cubic relation to fan speed (e.g., $P \propto U^3$) for lightly loaded aisles compared to floor plenums, which maintain a sufficiently high pressure differential for maximum flow across a floor tile to any highly loaded rack. In this way, the array of cooling units may adequately cool rows of cabinets having different heat loads.

In some examples, the cooling spine may permit maintenance of cooling components within or adjacent to the cooling spine. For example, arrays of cooling units bounding the cooling spine may be separated by a distance that provides space for servicing of riser modules, manifold modules, cooling units, fans, or any other component in or accessible through the cooling spine. Components of the cooling system, such as cooling units of the arrays of cooling units, may be installed, serviced, and/or removed through the service aisle without accessing the white space outside the cooling spine, thus eliminating additional clearances for maintenance and equipment removal within the white space and/or eliminating presence of maintenance personnel for mechanical equipment in the white space for more secure, critical equipment (e.g., information and communication technology (ICT)) equipment. In this way, a data hall may have a higher level of cleanliness and/or smaller footprint.

In some examples, the cooling spine may reduce an amount or distribution of cooling system infrastructure in a data center. For example, the riser modules and/or manifold modules may include one or more components configured to supply various utilities, such as cooling liquid or electrical power, from utility sources to the arrays of cooling units in a branched configuration. This branched configuration may include distribution of utilities to the cooling spine using interconnected riser modules and distribution of utilities within sections of the cooling spine using manifold modules. In this way, cooling system infrastructure may be consolidated along data halls and substantially limited to the cooling spine.

In some examples, the cooling spine may be configured to scale with and/or adapt to different configurations of data halls within a data center. For example, each riser module of a section of a cooling spine may couple to other riser modules of data halls above or below the cooling spine, such that utilities may be vertically distributed through the riser modules. In some instances, each manifold module of a section of the cooling spine may couple to other manifold modules of adjacent sections of the cooling spine. In this way, the cooling system infrastructure may scale with increased data center capacity while reducing installation of overlapping infrastructure. As another example, the data center may include one or more fire barriers along the cooling spine and/or perpendicular to the cooling spine to divide the data hall into two or more fire zones between data halls or within data halls of the data center. In instances in which the fire barriers separate data halls, the cooling spine may include power supplies for fans and cooling lines for cooling coils of the heat exchanger assemblies on each side of the fire barrier to supply the respective data hall with independent utilities. In this way, the modular cooling spine may be quickly installed, expanded, and/or segmented as a data center increases in data processing capacity.

In some examples, a system for cooling one or more data halls of a data center includes a section of a cooling spine. The section of the cooling spine includes a riser module, a manifold module, and an array of cooling units. The riser module includes riser piping configured to fluidically couple to a liquid cooling system. The manifold module includes manifold piping fluidically coupled to the riser piping. The array of cooling units is positioned toward a data hall of the one or more data halls. The array of cooling units includes a heat exchanger assembly fluidically coupled to the manifold piping and a circulation assembly. The heat exchanger assembly is configured to cool return air from a hot aisle adjacent a row of cabinets to generate supply air. The circulation assembly is configured to discharge the supply air to a cold aisle adjacent the row of cabinets.

In some examples of the above described system, the data hall is a first data hall on a first side of the cooling spine and the data center includes a second data hall on a second side of the cooling spine, opposite the first side. The array of cooling units includes a first array of cooling units positioned on a first side of the manifold module toward the first data hall and a second array of cooling units positioned on a second side of the manifold module toward the second data hall.

In some examples, a system for cooling a data center having a plurality of data halls includes a central cooling spine. The central cooling spine is positioned between a first one or more data halls of the plurality of data halls located on a first side of the central cooling spine and a second one or more data halls of the plurality of data halls located on a second side of the central cooling spine. The central cooling spine includes a first plurality of arrays of cooling units, a second plurality of arrays of cooling units, a plurality of riser modules, and a plurality of manifold modules. The first plurality of arrays of cooling units is positioned on the first side of the central cooling spine and the second plurality of arrays of cooling units is positioned on the second side of the central cooling spine, opposite the first side. Each of the first plurality of arrays of cooling units is configured to cool a row of cabinets in a data hall of the first one or more data halls on the first side, and each of the second plurality of arrays of cooling units is configured to cool a row of cabinets in a data hall of the second one or more data halls on the second side. The plurality of riser modules is positioned vertically within the central cooling spine. Each riser module includes riser piping configured to fluidically couple to a liquid cooling system. The plurality of manifold modules is positioned horizontally along the central cooling spine. Each manifold module includes manifold piping fluidically coupled to the riser piping of a corresponding riser module and at least one cooling unit of the first and second pluralities of arrays of cooling units. As such, the cooling spine may provide a central cooling supply which may scale to supply data halls that are horizontally adjacent (e.g., next to) and/or vertically adjacent (e.g., above or below).

In some examples, a data center includes one or more vertically arranged levels of a plurality of data halls and a system for cooling the plurality of data halls. The system for cooling the plurality of data halls includes a central cooling spine positioned between a first one or more data halls of the plurality of data halls located on a first side of the central cooling spine and a second one or more data halls of the plurality of data halls located on a second side of the central cooling spine. The central cooling spine includes a first plurality of arrays of cooling units, a second plurality of arrays of cooling units, a plurality of riser modules, and a plurality of manifold modules. The first plurality of arrays of cooling units is positioned on the first side of the central cooling spine and the second plurality of arrays of cooling units is positioned on the second side of the central cooling spine, opposite the first side. Each of the first plurality of arrays of cooling units is configured to cool a row of cabinets in a data hall of the first one or more data halls on the first side, and each of the second plurality of arrays of cooling units is configured to cool a row of cabinets in a data hall of the second one or more data halls on the second side. The plurality of riser modules is positioned vertically within the central cooling spine. Each riser module includes riser piping configured to fluidically couple to a liquid cooling system. The plurality of manifold modules is positioned horizontally along the central cooling spine. Each manifold module includes manifold piping fluidically coupled to the riser piping of a corresponding riser module and at least one cooling unit of the first and second pluralities of arrays of cooling units.

In some examples a method, performed by a computing device, for cooling a row of cabinets includes receiving a temperature measurement of supply air from a cold aisle and a temperature measurement of return air from a hot aisle adjacent the cold aisle. The method includes determining a temperature differential between the temperature measurement of the hot aisle and the temperature measurement of the cold aisle. The method further includes determining whether the temperature measurement of the cold aisle exceeds a threshold and whether the temperature differential exceeds a threshold. In response to determining that the temperature measurement of the cold aisle exceeds the threshold, the method further includes outputting a control signal to cause a manifold module to increase a flow rate of cooling liquid to a heat exchanger assembly intersecting the return air. In response to determining that the temperature differential exceeds the threshold, the method further includes outputting a control signal to cause a circulation assembly to increase a flow rate of the supply air to the cold aisle adjacent the hot aisle, thereby maintaining a relatively high differential temperature between the hot aisle and the cold aisle. In some examples, the method includes receiving a temperature measurement of supply air from a cooling spine adjacent the heat exchanger and determining whether a temperature differential between the temperature measurement of the hot aisle and the temperature measurement of the cooling spine is below a threshold to determine a coil failure in the heat exchanger. In some instances, the method includes receiving a pressure differential between the cold aisle and the hot aisle adjacent the cold aisle. The method further includes determining whether the pressure differential is less than a pressure override threshold indicating compromised air containment. In response to determining that the pressure differential is less than the pressure override threshold, the method includes controlling the flow rate of the supply air above a minimum flow rate.

DETAILED DESCRIPTION

Figure 1A:
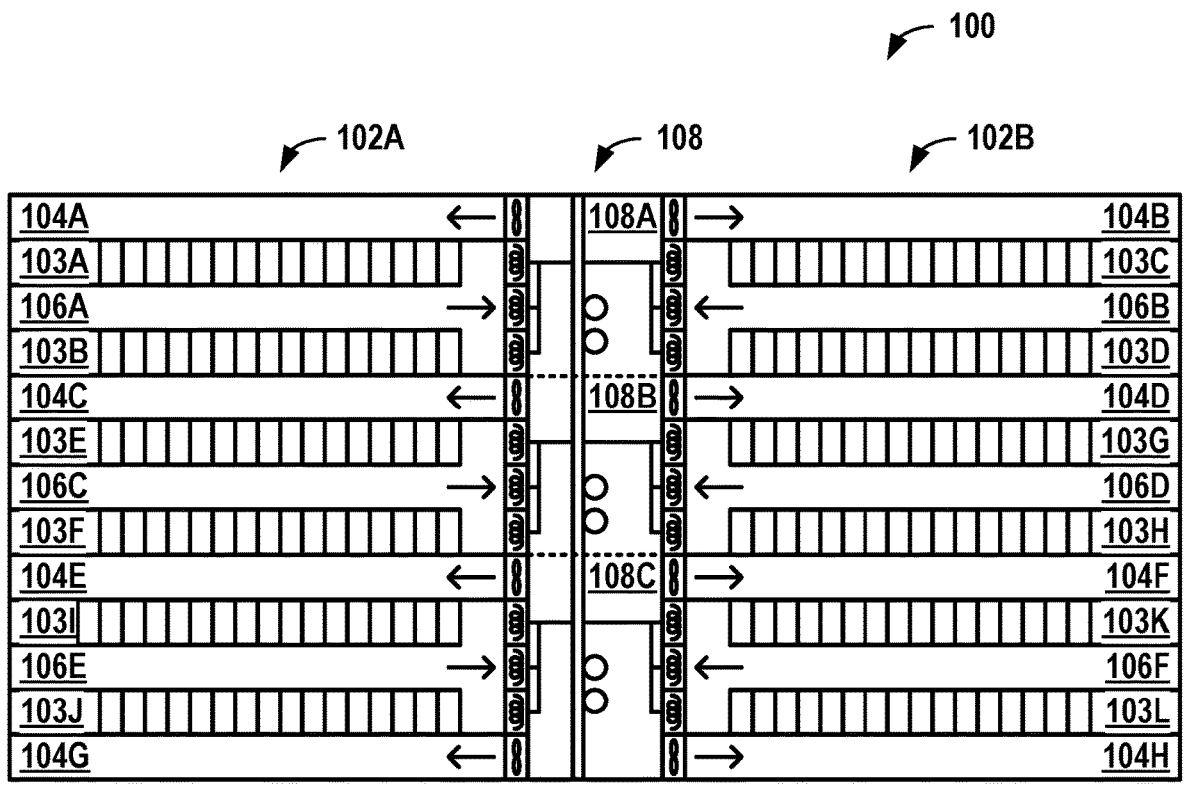
FIG. 1A is a conceptual diagram illustrating a top view of an example data hall of a data center, in accordance with one or more aspects of the present disclosure.

FIG. 1A is a conceptual diagram illustrating a top view of an example level of a data center 100, in accordance with one or more aspects of the present disclosure. In some examples, a data center may include one or more vertically arranged levels. For example, a data center in an urban environment may have a restricted footprint due to high cost or low availability of adjacent land. To expand such a data center with additional capacity, additional levels may be arranged vertically. As such, data center cooling systems discussed herein may include various features for more easily expanding a number or size of data halls 102 of a data center 100, as will be described further below. The example of FIG. 1A illustrates a single level; however, as will be illustrated in FIG. 4A, a data center may include multiple levels.

Each data center 100 includes one or more data halls 102 and a cooling spine 108 adjacent to each data hall 102. In the example of FIG. 1, data center 100 includes a first data hall 102A and a second data hall 102B (referred to individually as "data hall 102" and collectively as "data halls 102") such that cooling spine 108 is a central cooling spine; however, in other examples, data center 100 may include a single data hall 102 or more than two data halls 102. Each data hall 102 is configured to house a plurality of rows of cabinets 103. In the example of FIG. 1A, data hall 102A includes rows of cabinets 103A, 103B, 103E, 103F, 103I, and 103I, while data hall 102B includes rows of cabinets 103C, 103D, 103G, 103H, 103K, and 103L (referred to individually as "row of cabinets 103" and collectively as "rows of cabinets 103"). Each cabinet of a row of cabinets 103 may be configured to provide structure, security, and/or connectivity to computing devices within the respective cabinet. Each data hall 102 is bounded by cooling spine 108 and one or more walls separating data hall 102 from another environment, such as an external environment or another data hall 102. Data hall 102A is located on a first side of cooling spine 108 and data hall 102B is located on a second side of cooling spine 108, opposite the first side.

Each data hall 102 includes one or more cold aisles 104 perpendicular and adjacent to cooling spine 108. In the example of FIG. 1A, data hall 102A includes four cold aisles 104A, 104C, 104E, and 104G and data hall 102B includes four cold aisles 104B, 104D, 104F, and 104H (referred to individually as "cold aisle 104" and collectively as "cold aisles 104"). Each cold aisle 104 is parallel and adjacent to one or more rows of cabinets 103. In the example of FIG. 1A, cold aisles 104A, 104B, 104G, and 104H are each positioned between a single row of cabinets 103 and a wall of data center 100, while cold aisles 104C, 104D, 104E, and 104F are positioned between two adjacent rows of cabinets 103. Each cold aisle 104 is configured to receive cooled supply air from cooling spine 108 and provide the cooled supply air to adjacent rows of cabinets 103 of the respective cold aisle 104. In some examples, cold aisles 104 may be configured to provide access to computing devices of rows of cabinets 103. For example, cabinets of row of cabinets 103 may be configured so that computing devices may be installed and removed from cold aisles 104.

Each data hall 102 also includes one or more hot aisles 106 alternating with the one or more cold aisles 104 and perpendicular and adjacent to cooling spine 108. In the example of FIG. 1A, data hall 102A includes three hot aisles 106A, 106C, and 106E and data hall 102B includes three hot aisles 106B, 106D, and 106F (referred to individually as "hot aisle 106" and collectively as "hot aisles 106"). Each hot aisle 106 is adjacent to one or more rows of cabinets 103 and separated from adjacent cold aisles 104 by the adjacent rows of cabinets 103 and, optionally, one or more walls or barriers, such that supply air from adjacent cold aisles 104 may not mix with return air from adjacent hot aisles 106 without first passing through cabinets of the rows of cabinets 103. In the example of FIG. 1A, each hot aisle 106 is positioned between two adjacent rows of cabinets 103; however, in other examples, a hot aisle 106 may be adjacent to a single row of cabinets 103. Each hot aisle 106 is configured to receive warm return air from adjacent rows of cabinets of the respective hot aisle 106 and discharge the warm return air to cooling spine 108.

Cooling spine 108 includes one or more sections that form cooling spine 108. In the example of FIG. 1A, cooling spine 108 include sections of cooling spine 108A, 108B, and 108C; however, any number of sections may form cooling spine 108. Each section of cooling spine 108 is configured to discharge cooled supply air to an adjacent cold aisle 104 to cool one or more rows of cabinets 103 adjacent the respective cold aisle 104. Rather than provide bulk cooling to a corresponding data hall 102, a particular section of cooling spine 108 may provide cooled supply air to a particular cold aisle 104 based on a heat load of one or more rows of cabinets 103 adjacent to the respective cold aisle 104. In this way, cooling spine 108 may provide more individualized cooling to one or more rows of cabinets 103. Each section of cooling spine 108 is configured to cool the warmed return air from an adjacent hot aisle 106 to maintain a temperature of the cooled supply air in cooling spine 108. Rather than provide closed loop cooling to a corresponding row of cabinets 103, a particular section of cooling spine 108 may cool warmed return air from a particular hot aisle 106 based on a bulk temperature of cooling spine 108. This cooled return air may be mixed with cooled return air provided by other sections of cooling spine 108, such that cooled supply air discharged back into cold aisles 104 may be relatively uniform in temperature and/or other properties. For example, cooling spine 108 may create a uniform pressure zone or temperature zone to supply cold aisles with supply air. In this way, cooling spine 108 may cool return air from cabinets having large variances in heat load and provide cooled supply air to each cold aisle 104.

In some examples, cooling spine 108 may cool data center 100 occupying a smaller footprint than cooling systems that do not use a cooling spine to cool a data hall. For example, as will be explained below, cooling spine 108 may function as a plenum for cooled supply air, a service aisle for performing maintenance on cooling units, and a central plenum and service aisle for data centers having two or more data halls. As a result, data center 100 may have less floor space occupied by cooling infrastructure and service infrastructure as data centers that do not utilize a cooling spine 108 as discussed herein.

Figure 1B:
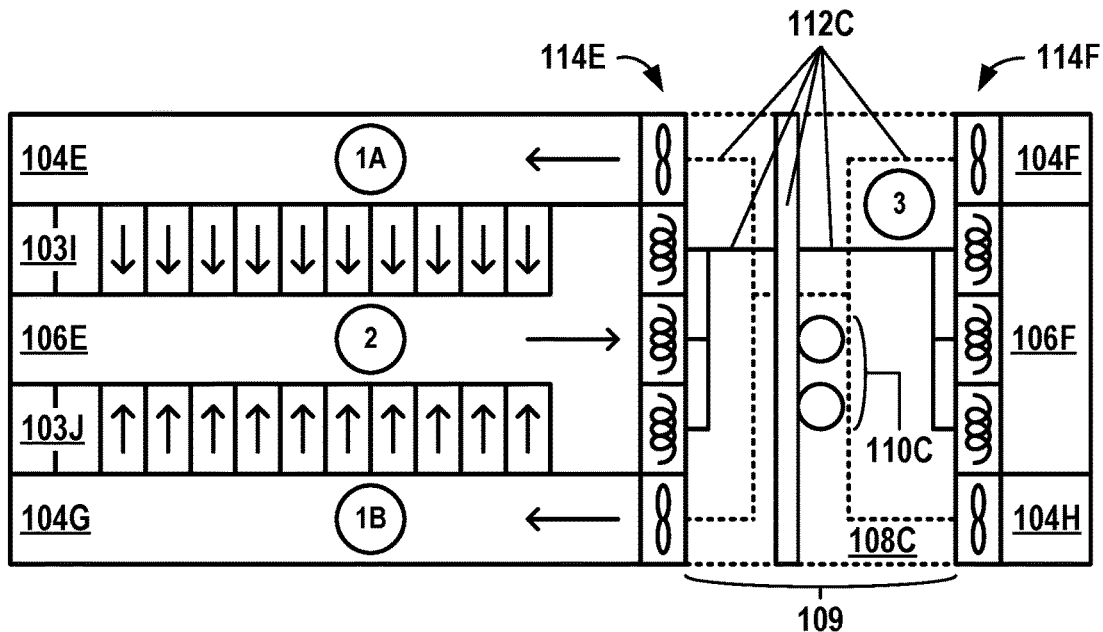
FIG. 1B is a conceptual diagram illustrating a top view of an example section of the data hall of FIG. 1A, in accordance with one or more aspects of the present disclosure.

Cooling spine 108 is configured to cool cabinets in one or more data halls 102. FIG. 1B is a conceptual diagram illustrating a top view of an example section of data center 100 of FIG. 1A, in accordance with one or more aspects of the present disclosure. The example section of FIG. 1B includes the section of cooling spine 108C, hot aisle 106E between two adjacent rows of cabinets 103I and 103J, and cold aisles 104E and 104G adjacent each of the adjacent rows of cabinets 103I and 103J opposite hot aisle 106E.

Each section of cooling spine 108 includes a riser module 110 (referred to individually as "riser module 110" and collectively as "riser modules 110"). Each riser module 110 may be configured to supply utilities to and from utility sources for cooling adjacent rows of cabinets 103. Each riser module 110 includes riser piping configured to fluidically couple to a liquid cooling system, either directly or through vertically adjacent riser modules 110. Riser module 110 may be configured to receive cooling liquid from the liquid cooling system and discharge cooling fluid to a manifold module 112 in data center 100. Riser module 110 may be configured to receive spent cooling fluid from manifold module 112 and return the spent cooling liquid to the liquid cooling system. Riser modules 110 may also include utility connections and infrastructure to couple to other utility sources, such as an electrical grid, and may be further configured to receive other utilities from the other utility sources and supply the other utilities to manifold module 112 in data center 100.

Each section of cooling spine 108 includes one or more manifold modules 112 (referred to individually as "manifold module 112" and collectively as "manifold modules 112"). Each manifold module 112 may be configured to distribute utilities between riser modules 110 and arrays of cooling units 114 for cooling adjacent rows of cabinets 103. Each manifold module 112 includes manifold piping fluidically coupled to riser piping (solid lines) of riser module 110. Manifold module 112 may be configured to receive cooling liquid from riser module 110 and discharge cooling fluid to array of cooling units 114. Manifold module 112 may be configured to receive spent cooling fluid from array of cooling units 114 and return the spent cooling liquid to riser module 110. One or more manifold modules 112 may also include utility connections and infrastructure configured to receive other utilities from riser module 110 and supply the other utilities to manifold module 112 in data center 100. For example, as illustrated in FIG. 1B, manifold module 112C may include electrical connections (dashed lines) to supply power to arrays of cooling units 114E and 114F. A cooling liquid distribution system that includes riser module 110 and manifold modules 112 may be configured such that a respective manifold module 112 may receive water from either a respective riser module 110, an adjacent manifold module 112 (thereby bypassing the respective riser module 110), or both the respective riser module 110 and adjacent manifold module 112. This multiplicity of connections may allow a plurality of level and/or rooms to be divided into zones running at differing temperatures. For example, one floor may run at a special temperature that may be supplied by only two riser modules 110, such that all manifold modules 112 on that particular floor may be only connected to each other and the two riser modules 110. At a same time, manifold modules 112 on other levels may be connected to each other and the remaining riser modules 110. As such, the data center may be divided into two temperature zones.

Each section of cooling spine 108 includes an array of cooling units 114 adjacent a data hall 102, such that cooling spine 108 may include a plurality of arrays of cooling units 114. In the example of FIG. 1B, array of cooling units 114E is adjacent a portion of data hall 102A. Each array of cooling units 114 may include one or more circulation assemblies configured to discharge cooled supply air from cooling spine 108 into adjacent cold aisles 104 and draw warmed return air from an adjacent hot aisle 106 into cooling spine 108. For example, array of cooling units 114E may include circulation assemblies configured to discharge supply air from section of cooling spine 108C into cold aisles 104E and 104G and draw warmed return air from hot aisle 106E through heat exchanger assemblies of array of cooling units 114 into section of cooling spine 108C.

Each array of cooling units 114 includes one or more heat exchanger assemblies configured to cool warmed return air from a hot aisle 106 of data hall 102 and discharge the cooled return air into cooling spine 108 as cooled supply air. For example, array of cooling units 114E may include heat exchanger assemblies configured to cool warmed return air from hot aisle 106E and discharge the cooled return air into section of cooling spine 108.

In the example of FIG. 1B, section of cooling spine 108C is illustrated cooling rows of cabinets 103I and 103J. For purposes of illustration, cold aisle 104E is at conditions 1A that includes a supply air pressure P1A and a supply air temperature T1A; cold aisle 104G is at conditions 1B that includes a supply air pressure P1B and a supply air temperature T1B; hot aisle 106E is at conditions 2 that includes a return air pressure P2 and a return air temperature T2; and section of cooling spine 108C is at conditions 3 that includes a spine air pressure P3 and a spine air temperature T3.

Circulation assemblies of array of cooling units 114C discharge cooled supply air to cold aisle 104E at supply air pressure P1A and to cold aisle 104G at supply air pressure P1B. Supply air pressure P1A may correspond to a particular amount (e.g., flow rate) of supply air to row of cabinets 103I to maintain a differential temperature across row of cabinets 103I, while supply air pressure P1B may correspond to a particular amount of supply air to a second row of cabinets 103J to maintain a differential temperature across row of cabinets 103J. Row of cabinets 103I may have a different heat load than row of cabinets 103J, such that the particular amount of supply air to maintain row of cabinets 103I at the temperature differential, which may be different than the particular amount of supply air to maintain row of cabinets 103J at the temperature differential. By using temperature differential to control a flow rate of air to respective rows of cabinets, the circulation assemblies may prevent an over or under supply of air to the cabinets 103. In some examples, pressure differential may be used as an interlock for an override condition. For example, a breach of containment may cause a low temperature differential, which may cause the cooling assemblies to reduce a flow rate of supply air without an interlock. A low pressure differential may indicate the containment breach, such that the circulation assemblies may not be controlled by the low temperature differential.

The cooled supply air may flow through the rows of cabinets 103I and 103J into hot aisle 106E at least partially due to respective pressure differentials between supply air pressures P1A and P1B and return air pressure P2. For example, hot aisle 106E may have a return air pressure P2 that is less than supply air pressure P1A or P1B of adjacent cold aisles 104I and 104J. A flow of cooled supply air through the rows of cabinets 103I and 103J may be controlled by fans within cabinets 103 configured to regulate flow through the respective cabinet 103. As the supply air flows through the cabinets of the rows of cabinets 103I and 103J, the supply air removes heat from the cabinets of the rows of cabinets 103I and 103J and increases in temperature. As a result, the warmed return air temperature T2 is higher than the cooled supply air temperatures T1A and T1B.

Circulation assemblies of array of cooling units 114E draw warmed return air from hot aisle 106E through heat exchanger assemblies of array of cooling units 114E. For example, section of cooling spine 108C may have a spine air pressure P3 that is less than the return air pressure P2 of hot aisle 106E, such that the heated return air flows from hot aisle 106E through the heat exchanger assemblies of array of cooling units 114E. Array of cooling units 114E cools return air from hot aisle 106E and discharges the cooled return air into a volume of the section of cooling spine 108C. The heat exchanger assemblies of array of cooling units 114E may receive cooling liquid from manifold module 112C, remove heat from the warmed return air using the cooling liquid, and discharge warmed cooling liquid to manifold module 112C. A flow of cooling liquid to and from the heat exchanger assemblies of array of cooling units 114E may be selected to supply a particular amount of cooling liquid to cool hot aisle 106E. As a result, spine air temperature T3 is lower than return air temperature T2.

Figure 2A:
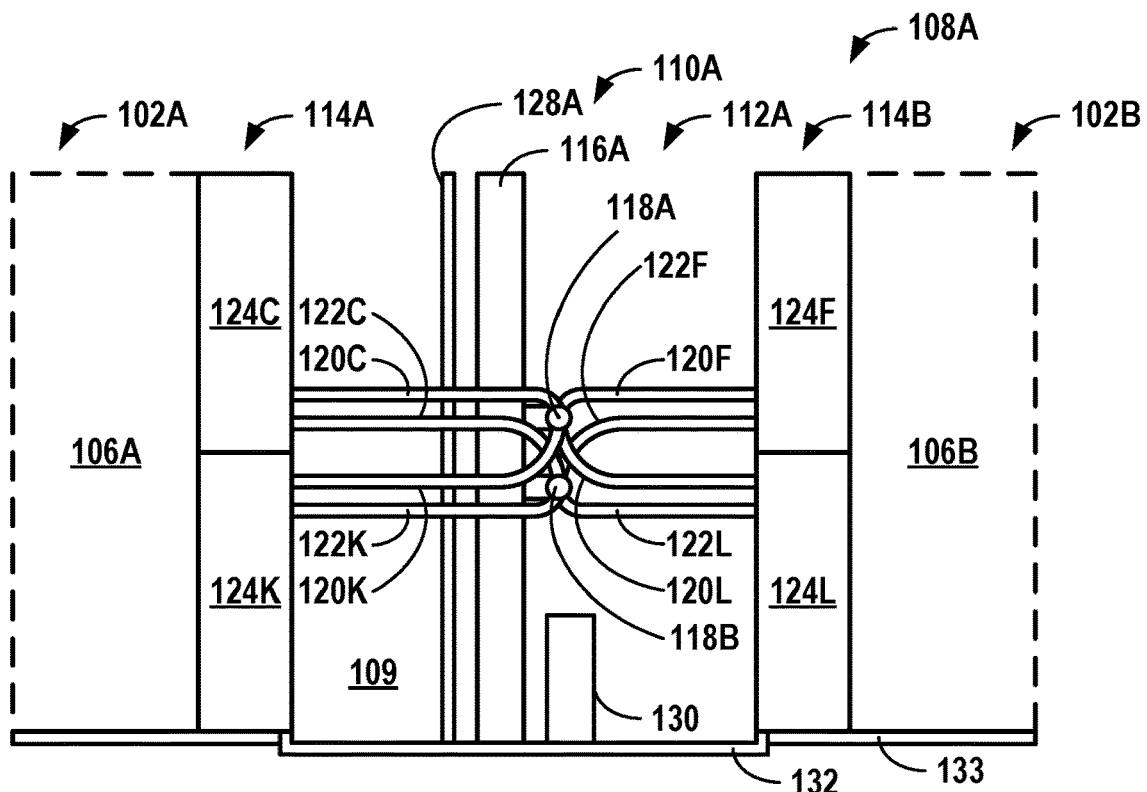
FIG. 2A is a conceptual diagram illustrating a side view of an example section of a cooling spine of a data center cooling system, in accordance with one or more aspects of the present disclosure.
Figure 2B:
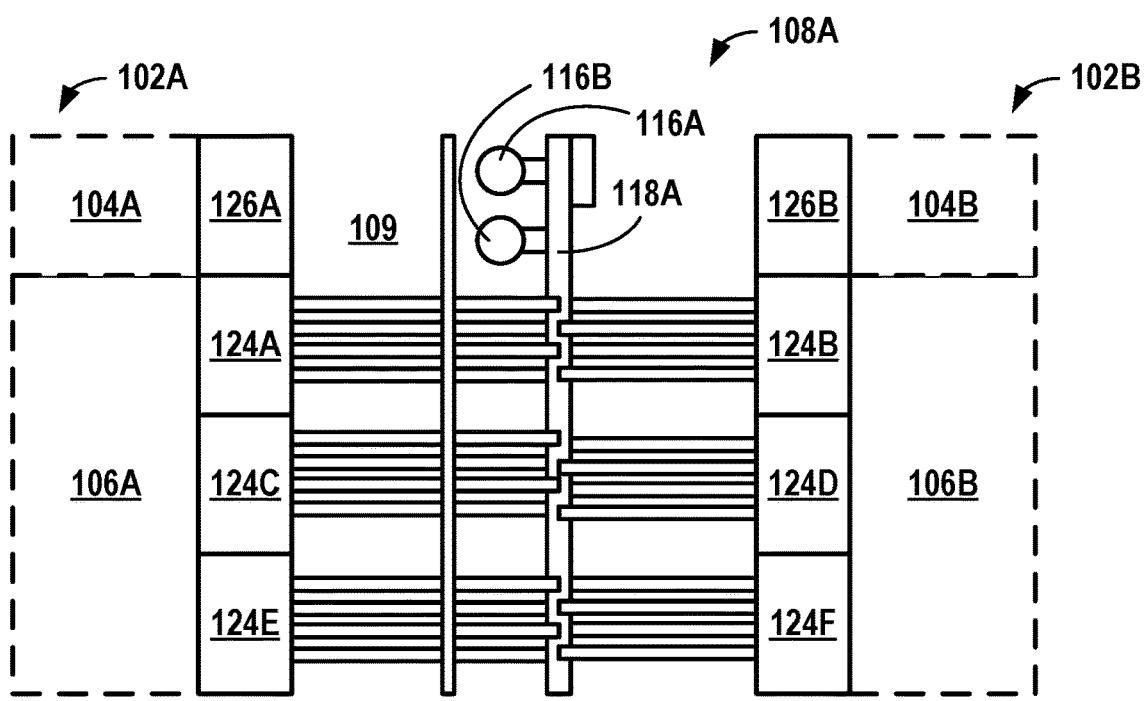
FIG. 2B is a conceptual diagram illustrating a top view of an example section of the cooling spine of FIG. 2A, in accordance with one or more aspects of the present disclosure.

FIG. 2A is a conceptual diagram illustrating a side view of an example section of a cooling spine 108A, while FIG. 2B is a conceptual diagram illustrating a top view of example section of the cooling spine 108A of FIG. 2A, in accordance with one or more aspects of the present disclosure. While FIGS. 2A and 2B will be described with respect to section of cooling spine 108A, the principles discussed in FIGS. 2A and 2B may be applied to any sections of a cooling spine as discussed herein. Each section of cooling spine 108 may be configured as a modular unit for expanding cooling system capacity to rows of cabinets 103 within a same section of data center 100, rows of cabinets 103 in horizontally adjacent sections of data center 100, and/or rows of cabinets 103 in vertically adjacent levels of data center 100. Each section of cooling spine 108 may be configured to be quickly assembled. For example, each section of cooling spine 108 may include components having standard specifications and interfaces.

Each section of cooling spine 108 includes one or more arrays of cooling units 114 and a service aisle 109 positioned between an array of cooling units 114 and either a wall of data center 100 or another array of cooling units 114. In the example of FIGS. 2A and 2B, section of cooling spine 108A includes an array of cooling units 114A positioned on a first side of service aisle 109 toward data hall 102A and an array of cooling units 114B positioned on a second side of service aisle 109 toward data hall 102B. Service aisle 109 may be divided by a spine firewall module 128A. Riser module 110A, manifold module 112A, and one or more filtration units 130 are positioned in and accessible by service aisle 109. Riser module 110A and manifold module 112A may be configured to supply utilities to one or more arrays of cooling units 114A and 114B in section of the cooling spine 108A.

In some examples, service aisle 109 may be configured to permit access to and/or maintenance of components of cooling spine 108. For example, cooling spine 108 may substantially contain cooling infrastructure for data center 100. As such, components of cooling spine 108 may be accessed from service aisle 109. In some examples, service aisle 109 may have a width that permits maintenance of components of cooling spine 108, such as a width of at least about 4 feet. Maintenance of components of cooling spine 108 may include, but is not limited to, repair, installation, removal, or testing of components of cooling spine 108.

Riser module 110 and manifold module 112 may be configured to supply cooling liquid from a liquid cooling system to one or more heat exchanger assemblies 124. Heat exchanger assembly 124 may include any heat exchanger component or group of components configured to cool return air using a cooling liquid. A variety of heat exchanger assemblies may be used including, but not limited to, cooling coil assemblies, and the like. In the example of FIGS. 2A and 2B, array of cooling units 114A includes heat exchanger assemblies 124A, 124C, 124E, 124G (not shown), 124I (not shown), and 124K, while array of cooling units 114B includes heat exchanger assemblies 124B, 124D, 124F, 124H (not shown), 124J (not shown), and 124L (referred to individually as "heat exchanger assembly 124" and collectively as "heat exchanger assemblies 124"). The liquid cooling system may include any liquid cooling system configured to supply cooling liquid to heat exchanger assemblies 124 of data center 100. Liquid cooling systems that may be used may include, but are not limited to, cooling water systems, refrigeration systems, and the like. The liquid cooling system may include a variety of equipment for supplying cooling liquid to heat exchanger assemblies 124 including, but not limited to, pumps, valves, heat exchangers, and the like.

Each riser module 110 includes riser piping 116A and 116B (referred to individually and collectively as "riser piping 116") configured to fluidically couple to the liquid cooling system. In the example of FIGS. 2A and 2B, riser piping 116 includes riser supply piping 116A configured to supply cooling liquid from the liquid cooling system to manifold piping 118 and riser return piping 116B configured to return cooling liquid from manifold piping 118 to the liquid cooling system.

Each manifold module 112 includes manifold section piping 118, manifold unit supply piping 120, and manifold unit return piping 122. Manifold section piping 118 is configured to distribute and collect cooling liquid to and from heat exchanger assemblies 124 within a section of cooling spine 108. Manifold unit supply piping 120 is configured to distribute cooling liquid to particular heat exchanger assemblies 124 within a section of cooling spine 108, while manifold unit return piping 122 is configured to collect cooling liquid from particular heat exchanger assemblies 124 within a section of cooling spine 108. Manifold section piping 118 is fluidically coupled to riser piping 116, manifold unit supply piping 120, and manifold unit return piping 122, while manifold unit supply piping 120 and manifold unit return piping 122 are fluidically coupled to manifold section piping 118 and a respective heat exchanger assembly of an array of cooling units 114. In the example of FIGS. 2A and 2B, manifold supply section piping 118A and manifold unit supply piping 120C, 120F, 120K, and 120L are configured to supply cooling liquid from riser supply piping 116A to heat exchanger assemblies 124C, 124F, 124K, and 124L, respectively, while manifold return section piping 118B and manifold unit return piping 122C, 122F, 122K, and 122L are configured to return cooling liquid from heat exchanger assemblies 124C, 124F, 124K, and 124L, respectively, to riser return piping 116B.

In some examples, riser piping 116 may be vertical and manifold section piping 118 may be horizontal. For example, riser piping 116 may be configured to transport cooling liquid vertically to different data halls of a data center, such as from an upper level housing the liquid cooling system to one or more data halls located beneath the liquid cooling system. Manifold section piping 118 may be configured to transport cooling liquid horizontally within a section of cooling spine 108 or between adjacent sections of cooling spine 108. This vertical bulk distribution and horizontal local distribution may enable a shorter flow path and/or more uniform conditions (i.e. temperature and pressure) of cooling liquid. Such a vertical design may permit a liquid cooling system to be positioned vertically within a data center, such that the data center may be capable of fitting within a smaller or less flexible footprint.

In some examples, riser piping 116 and manifold section piping 118 may be configured to couple to adjacent riser piping 116 and/or manifold section piping 118. For example, riser piping 116 may include connectors, such as flanges, configured to mechanically couple to riser piping 116 of one or more vertically adjacent riser modules 110, such as in a cooling spine 108 of a vertically adjacent data hall. Similarly, manifold section piping 118 may include connectors, such as flanges, configured to mechanically couple to manifold section piping 118 of one or more horizontally adjacent manifold modules 112, such as in a horizontally adjacent section of cooling spine 108 within a same data hall. As a result, a distribution system of riser modules 110 and manifold modules 112 may be divided into more than one temperature zone for the fluid cooling.

Each array of cooling units 114 includes one or more heat exchanger assemblies 124 fluidically coupled to manifold unit supply piping 120 and manifold unit return piping 122. Each heat exchanger assembly 124 is configured to receive cooling liquid from manifold unit supply piping 120 and discharge warmed cooling liquid to manifold unit return piping 122. Each heat exchanger assembly 124 is positioned between a respective hot aisle 106 and a respective section of cooling spine 108. In the example of FIGS. 2A and 2B, each heat exchanger assembly 124 is positioned between service aisle 109 and a respective hot aisle 106A or 106B, such that return air drawn into service aisle 109 impinges upon and passes through a heat exchanger assembly 124 of the respective array of cooling units 114A and 114B. Each heat exchanger assembly 124 is configured to cool return air from a respective hot aisle 106 adjacent a row of cabinets 103 by removing heat from the return air into the cooling liquid. Each heat exchanger assembly 124 is configured to discharge the cooled return air to a volume of cooling spine 108 and discharge the warmed cooling liquid back to manifold unit supply piping 120.

In some examples, manifold unit supply piping 120 and/or manifold unit return piping 122 may include one or more control valves configured to control a flow of cooling liquid to a respective heat exchanger assembly 124. For example, the one or more control valves may be communicatively coupled to a controller (not shown) and configured to receive control signals from the controller and control a flow of cooling liquid to a respective heat exchanger assembly 124 based on the control signals. In some examples, the one or more control valves may receive control signals based on a temperature of cooling air leaving heat exchanger assembly 124. As a result, under very different power densities, a temperature of cooling air leaving heat exchanger assemblies 124A, 124C, 124E, 124G, 124I, and 124K and a temperature of cooling air leaving heat exchanger assemblies 124B, 124D, 124F, 124H, 124J, and 124L may be substantially similar due to their independent control of off-coil temperature.

In some examples, riser module 110 and manifold module 112 may be configured to supply electrical power from a power source to one or more circulation assemblies 126. In the example of FIGS. 2A and 2B, array of cooling units 114A includes circulation assemblies 126A and 126C (not shown), while array of cooling units 114B includes circulation assemblies 126B and 126D (not shown) (referred to individually as "circulation assembly 126" and collectively as "circulation assemblies 126").

In some examples, riser module 110 and manifold module 112 are configured to create one or more temperature zones between a first data hall and a second data hall, such as data halls 102A and 102B of FIG. 1A. For example, rows of cabinets 103 in data hall 102A may be operated under different conditions, such as temperatures, as rows of cabinets 103 in data hall 102B. As an example, one or more riser modules 110 on a floor may supply water having a first temperature to data hall 102A, while one or more other riser modules 110 on the floor may supply water having a second temperature to data hall 102B. Manifold modules 112 may be configured such that a respective manifold module 112 may receive water from either a respective riser module 110 or an adjacent manifold module 112 (thereby bypassing the respective riser module 110), such that the two different temperatures may be supplied to different data halls 102A and 102B. In this way, computing devices operated under different cooling conditions may be present in a same data center 100.

Each array of cooling units 114 includes one or more circulation assemblies 126 electrically coupled to power infrastructure. Each circulation assembly 126 is configured to receive power from the power infrastructure. In the example of FIGS. 2A and 2B, each circulation assembly 126 is positioned between service aisle 109 and a respective cold aisle 104A or 104B, such that supply air drawn from the section of cooling spine 108 passes through circulation assembly 126 and discharges into the respective cold aisle 104A or 104B. Each circulation assembly 126 is configured to discharge supply air to a respective cold aisle 104 adjacent a row of cabinets 103 by creating a positive pressure differential between the respective cold aisle 104 and the section of cooling spine 108.

In some examples, circulation assemblies 126 may include one or more speed regulators configured to control a flow of supply air to a respective cold aisle 104. For example, the one or more speed regulators may be communicatively coupled to a controller (not shown) and configured to receive control signals from the controller and control a flow of supply air to a respective cold aisle 104 based on the control signals. In some examples, the one or more speed regulators may receive control signals based on a temperature differential between a temperature of return air in hot aisle 106 and a temperature of supply air in cold aisle 104. As an example, if a temperature differential between hot aisle 106A and cold aisle 104A is greater than a temperature differential between hot aisle 106B and cold aisle 104B, circulation assemblies 126A and 126C may receive control signals to control flow of supply air at a first flow rate, while circulation assemblies 126B and 126D may receive control signals to control flow of supply air at a second flow rate that is less than the first flow rate, due to a higher temperature differential between hot aisle 106A and cold aisle 104A.

Each section of cooling spine 108 may include additional support infrastructure configured to support components of the section of cooling spine 108. For example, each section of cooling spine 108 may be modular, such that the section of cooling spine 108 may be standardized and capable of being installed and/or assembled quickly. In some examples, each riser module 110 includes riser framing (not shown).

Riser framing may be configured to support components of riser module 110, such as riser piping 116 and/or power infrastructure. In some examples, each manifold module 112 includes manifold framing (not shown). Manifold framing may be configured to support cooling liquid infrastructure of manifold module 112, such as manifold section piping 118, manifold unit supply piping 120, and manifold unit return piping 122; power infrastructure of manifold module 112, such as electrical wiring, electrical conduits, and/or one or more power supplies; and the like. For example, the manifold framing may be coupled to manifold piping, the riser framing, and/or one or more power supplies. In some examples, riser framing and/or manifold framing may be configured to integrate directly with a primary structure of a building housing data center 100. For example, riser framing and/or manifold framing may be steel framing configured (e.g., sized and/or shaped) to fit and/or couple to infrastructure, such as floor, ceiling, beams, or other supports of the primary structure. In this way, each section of cooling spine 108 may be fabricated without additional building infrastructure or secondary fixings.

In some examples, cooling spine 108 may include a filtration system configured to filter supply air from service aisle 109. The filtration system may include one or more filtration units 130 in one or more sections of cooling spine 108. A quantity of filtration units 130 for a cooling spine 108 may correspond to an amount of filtration and/or a redundancy of filtration units to provide supply air at a desired level of filtration. In some examples, a minimum level of filtration may be above MERV 8. Rather than filter supply air directly in-line of a flow path of return and/or supply air, each filtration unit 130 may be configured to receive supply air from a common volume of service aisle 109, filter the supply air from service aisle 109, and discharge the filtered supply air back to service aisle 109. In this way, filtration units 130 in cooling spine 108 may condition the common volume of supply air as a side stream, rather than an in-line stream. Side stream filtering may filter supply air with a lower pressure drop and/or using a lower volume for an equivalent level of filtration as in-line filtering. As such, an amount of power (e.g., a fan power requirement) to adequately circulate and/or filter supply air through a flow path of cooling spine 108, cold aisle 104, and hot aisle 106 may be reduced compared to a flow path of supply and return air in which filtration is performed in-line.

In some examples, one or more sections of cooling spine 108 may include a spine firewall module 128. Each spine firewall module 128 may be configured to provide a fire barrier between sections of a data hall, such as between data hall 102A and data hall 102B. In the example of FIGS. 2A and 2B, spine firewall module 128A is positioned in service aisle 109 between arrays of cooling units 114A and 114B. As such, data hall 102A and data hall 102B may be in different fire zones. Spine firewall module 128 may include any firewall module capable of providing fire resistance between opposite sides of spine firewall module 128. In some instances, firewall module 128 may be a pre-certified and pre-fabricated sandwich panel assembly manufactured to suit a geometry of cooling spine 108. Sufficient clearance may be included in manifold module 112 to ensure a fire rating of pipework penetration is reached, such as by using pre-approved cladding each side of firewall module 128. In some examples, spine firewall module 128 may be separated from an array of cooling units 114 by at least three feet. Similarly, cooling fluid piping may include flexible hoses having a suitable fire rating or include flexible hoses constructed of non-flammable material. Power supplies for fans and cooling supply for coils may be routed independently on each side of firewall module 128.

In some examples, cooling spine 108 may include a floor module 132 forming a service aisle floor. Floor module 132 may be configured to collect and drain fluids, such as cooling liquids, from components of cooling spine 108. Floor module 132 may be positioned below a plane of a data hall floor 133 of data center 100. For example, floor module 132 may be positioned greater than about 1 centimeter below the plane of data hall floor 133 of data hall 100, such as about 7.5 centimeters below the plane of data hall floor 133. In some examples, collection and drainage of fluids in data 102 may be limited to cooling spine 108. For example, all pipework for distributing cooling liquids for cooling data halls 102A and 102B may be substantially limited to cooling spine 108, such that data halls 102A and 102B may be substantially free of fluid distribution, collection, and drainage infrastructure.

Figure 3A:
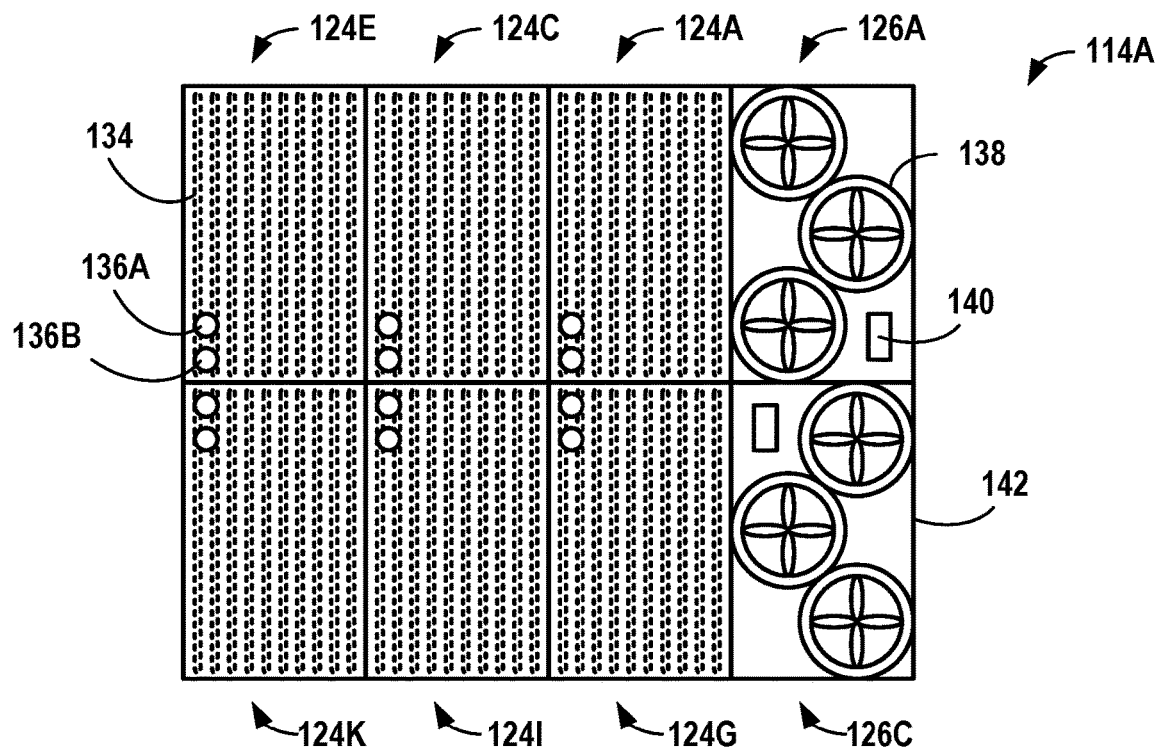
FIG. 3A is a conceptual diagram illustrating a side view of an example array of cooling units, in accordance with one or more aspects of the present disclosure.

FIG. 3A is a conceptual diagram illustrating a side view of an example array of cooling units 114A, in accordance with one or more aspects of the present disclosure. While FIG. 3A will be described with respect to array of cooling units 114A, the principles discussed in FIG. 3A may be applied to any array of cooling units as discussed herein.

Each array of cooling units 114 includes at least one heat exchanger assembly 124 and at least one circulation assembly 126 (generically referred to individually as "cooling unit 124 or 126" and collectively as "cooling units 124 and 126"). In the example of FIG. 3A, array of cooling units 114A includes six heat exchanger assemblies 124A, 124C, 124E, 124G, 124I, and 124K, and two circulation assemblies. However, as will be illustrated in FIG. 3B, an array of cooling units 114 may include different configurations of cooling units 124 and 126 within the array of cooling units 114.

In the example of FIG. 3A, each heat exchanger assembly 124 includes a cooling coil assembly, illustrated with respect to heat exchanger assembly 124E. Each cooling coil assembly includes one or more cooling coils 134, a cooling liquid inlet 136A, and a cooling liquid outlet 136B. Each cooling coil assembly is configured to receive cooling liquid from cooling liquid inlet 136A, flow cooling liquid through cooling coils 134 to remove heat from return air passing by cooling coils 134, and discharge warmed cooling liquid from cooling liquid outlet 136B.

In the example of FIG. 3A, each circulation assembly 126 includes a fan assembly, illustrated with respect to circulation assembly 126A. Each fan assembly includes one or more fans 138 and a power module 140 that includes a power source and a controller. Each fan 138 of each fan assembly is configured to receive electrical power from power module 140 and discharge supply air using the electrical power. In the example of FIG. 3A, each fan assembly includes three fans 138; however, in other examples, each fan assembly may include greater or fewer than three fans 138. The controller may be configured to control fan assemblies of circulation assemblies and cooling coils of heat exchanger assemblies. While shown as two separates power modules 140, in some examples, heat exchanger assemblies 124 and circulation assemblies 126 of an array of cooling units 114 may share a power module 140, such that the controller may control circulation assemblies 126 to discharge supply air into a corresponding cold aisle 104 and control heat exchanger assemblies 124 to cool return air from a corresponding hot aisle. For example, each cold aisle 104 and each hot aisle 106 may be associated with a controller configured to control supply air into the respective cold aisle 104 and cool return air from a respective hot aisle 106 in a distributed, decentralized manner. As such, the controller for each array of cooling units 114 may be part of a modular extensible control system.

In some examples, each array of cooling units 114 may be configured for redundancy within the array of cooling units 114. For example, if one cooling unit, such as cooling coils 134 or fans 138, fail, the remaining cooling devices of an array of cooling units 114 may continue to cool return air from an adjacent hot aisle 106 or discharge supply air into an adjacent cold aisle 104, thereby diluting the effect of the failed cooling coils 134 or fans 138. In some examples, each array of cooling units 114 may be configured with at least 20% redundant capacity (5+1), such that each fan assembly includes at least five fans and each cooling coil assembly includes at least five cooling coils operating at a time. In the example of FIG. 3A, array of cooling units 114A includes six cooling coil assemblies (5+1) and two fan assemblies, each including three fans (5+1). As such, if a cooling coil of a cooling coil assembly or a fan of a fan assembly fails, the remaining cooling coils 134 of the other five operating cooling coil assemblies or the remaining five operating fans 138 of the two fan assemblies may be configured to adequately cool return air from the adjacent hot aisle 106 and discharge supply air to the adjacent cold aisle 104. As a result, as a data hall 102 is partitioned into multiple rooms, there may be reduced space or capacity loss relative to such loss typically associated with re-introducing redundant cooling units to the separated area, as redundancy may be already included on an aisle by aisle basis.

For example, for each circulation assembly 126, the four closest cooling coils 134 may deliver an aggregate two thirds of a volume of return air for the circulation assembly, while the next four closest cooling coils 134 may deliver the remaining one third volume. As such any failed coil allowing warm air into the spine will only provide one sixth or one twelfth of a cold aisle 104 air volume depending on a relationship of the cooling coil 134 to the circulation assembly 126.

In some examples, each array of cooling units 114 may include an upper array of cooling units and a lower array of cooling units. In the example of FIG. 3A, array of cooling units 114A includes an upper array of cooling units 124A, 124C, 124E, and 126A and a lower array of cooling units 124G, 124I, 124K, and 126C.

In some examples, each array of cooling units 114 may include support infrastructure to physically support cooling units 124 and 126 and infrastructure for operating cooling units 124 and 126. Array of cooling units 114 may include an array frame 142. Array frame 142 may be configured to house one or more cooling units 124 and 126 of array of cooling units 114. In some examples, cooling units 124 and 126 of each array of cooling units 114 may be removably coupled to array frame 142. For example, array frame 142 and/or each cooling unit 124 and 126 may include an attachment mechanism configured to secure a respective cooling unit 124 or 126 into array frame 142. In some examples, array frame 142 and/or cooling units 124 and 126 may be configured to permit removal of cooling units 124 and 126 from array frame 142 into service aisle 109. Array frame 142 may be configured to interchangeably receive and secure circulation assemblies and cooling coil assemblies, such that array frame 142 may be configurable for various arrangements of hot aisles and cold aisles in situ without moving array frame 142.

Figure 3B:
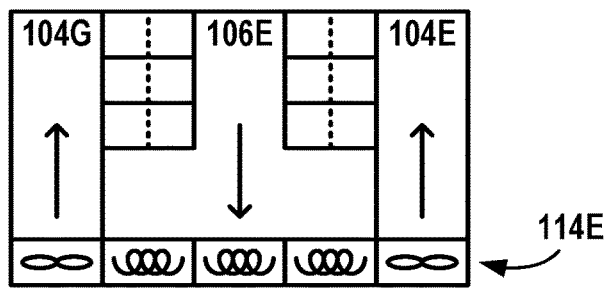
FIG. 3B is a conceptual diagram illustrating a top view of an example five width section array of cooling units, in accordance with one or more aspects of the present disclosure.
Figure 3C:
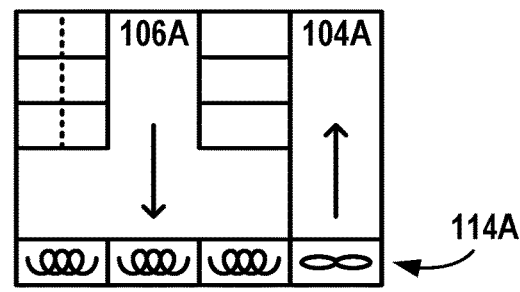
FIG. 3C is a conceptual diagram illustrating a top view of an example four width section array of cooling units, in accordance with one or more aspects of the present disclosure.

Arrays of cooling units 114 discussed herein may have a variety of configurations that correspond to a number and size of hot aisles 106 and cold aisles 104 adjacent the array of cooling units. FIG. 3B is a conceptual diagram illustrating a top view of an example five section width array of cooling units 114E, while FIG. 3C is a conceptual diagram illustrating a top view of an example four section width array of cooling units 114A, in accordance with one or more aspects of the present disclosure. As shown in FIG. 3B, array of cooling units 114E is configured to discharge supply air to two cold aisles 104E and 104G and cool return air from one hot aisle 106E. As such, array of cooling units 114E includes one circulation assembly for each cold aisle 104E and 104G and three heat exchanger assemblies for hot aisle 106E. As shown in FIG. 3C, array of cooling units 114A is configured to discharge supply air to one cold aisle 104A and cool return air from one hot aisle 106A. As such, array of cooling units 114A includes one circulation assembly for cold aisle 104A and three heat exchanger assemblies for hot aisle 106A.

In the examples of FIGS. 3B and 3C, in addition to being separated by cabinets 103, adjacent hot aisles 106 and cold aisles 104 may be separated by an air containment that includes one or more containment walls configured to separate the respective hot aisle 106 and cold aisle 104 in areas above cabinets 103 and adjacent to cabinets 103. For example, as shown in FIG. 3B, cold aisles 104E and 104G are separated from hot aisle 106E by containment walls adjacent to cabinets 103, such that the air containment forms a T-shape. As a result, three heat exchanger assemblies may be present for each circulation assembly, such that a surface area of cooling coils may be three times a surface area of the circulation assemblies. As another example, as shown in FIG. 3B, cold aisles 104E and 104G are separated from hot aisle 106E by containment walls above cabinets 103 (dashed lines) positioned halfway across the tops of cabinets 103, such that each of cold aisles 104E and 104G may have a substantially similar aisle width as hot aisle 106E. As such, the air containment section may enable hot aisles 106 and cold aisles 104 to have a variety of relative widths, including a same width, while maintaining a ratio of a coil area to a fan area that is configured to reduce air speed and increase an efficiency of the coils. In some configurations, such a 3:1 ratio as illustrated in FIGS. 3B and 3C may provide adequate cooling for rows of cabinets 103 adjacent the respective hot aisle 106 and cold aisle 104 and may provide adequate space in the respective hot aisle 106 and cold aisle 104 for servicing cabinets of the rows of cabinets 103. For example, each heat exchanger assembly may have a relatively large surface area to permit high flow rates of return air through the heat exchanger assembly at low energy consumption. These high flow rates may permit a higher power to cabinet ratio and/or high cabinet count per data hall 102 as compared to cooling systems with lower flow rates. Arrays of cooling units 114 may have other configurations such as section widths, ratios of heat exchanger assemblies to circulation assemblies, and the like, based on dimensions (e.g., widths, heights, or volumes of hot aisles 106 and/or cold aisles 104) and cooling characteristics (e.g., heat load or number of cabinets in rows of cabinets 103) of hot aisles 106, cold aisles 104, and/or rows of cabinets 103.

Figure 3D:
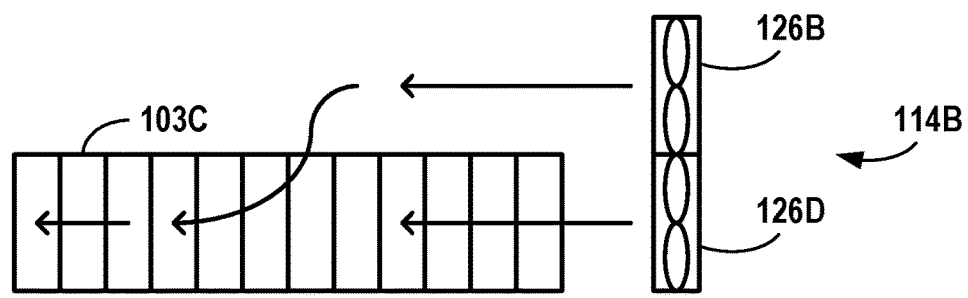
FIG. 3D is a conceptual diagram illustrating a side view of an example two height section array of cooling units, in accordance with one or more aspects of the present disclosure.

Arrays of cooling units 114 discussed herein may have more than one vertical row. FIG. 3D is a conceptual diagram illustrating a side view of an example two section height array of cooling units 114B, in accordance with one or more aspects of the present disclosure. In some examples, one or more circulation assemblies 126 of a lower array of cooling units and an upper array of cooling units may be configured to discharge supply air to different portions of a row of cabinets 103. As shown in FIG. 3D, circulation assembly 126D of a lower array of cooling units may be configured to discharge supply air to a first portion of row of cabinets 103C, while circulation assembly 126B of an upper array of cooling units may be configured to discharge supply air to a second portion of row of cabinets 103C. In this way, a more even flow of supply air may be discharged along a row of cabinets 103.

Figure 4A:
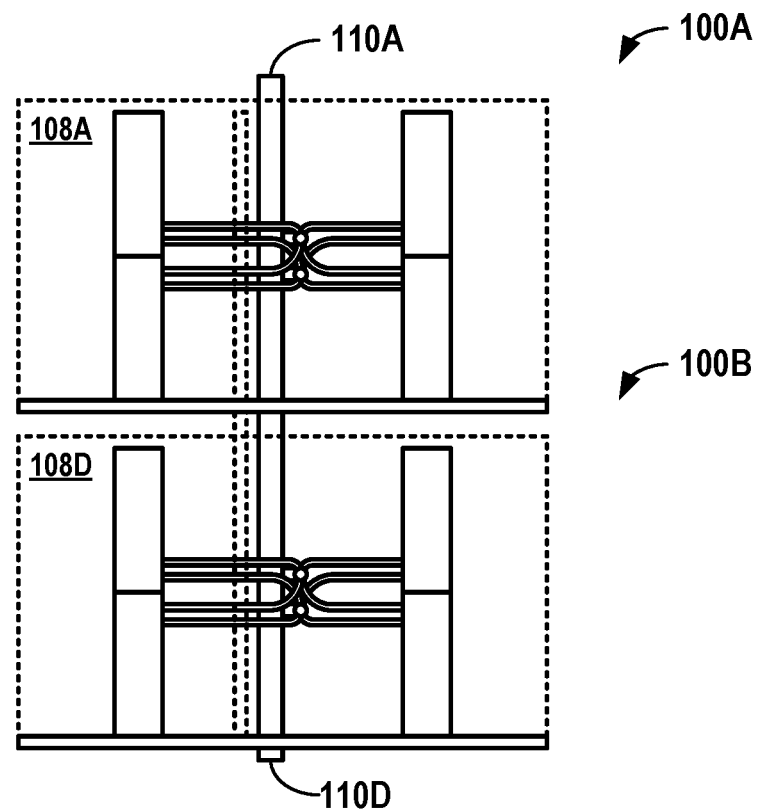
FIG. 4A is a conceptual diagram illustrating a side view of two example vertically connected sections of two cooling spines of two vertically adjacent data halls, in accordance with one or more aspects of the present disclosure.

FIG. 4A is a conceptual diagram illustrating a side view of two example vertically connected sections of two cooling spines 108A and 108D, in accordance with one or more aspects of the present disclosure. In the example of FIG. 4A, section of cooling spine 108A is located in first level of data center 100A and includes a riser module 110A, while section of cooling spine 108D is located in a second level of data center 100B and includes a riser module 110B. Riser module 110A is fluidically coupled to riser module 110D such that, in a cooling system in which a liquid cooling system is coupled to riser module 110A, riser module 110A may transport cooling liquid to and from riser module 110D.

Figure 4B:
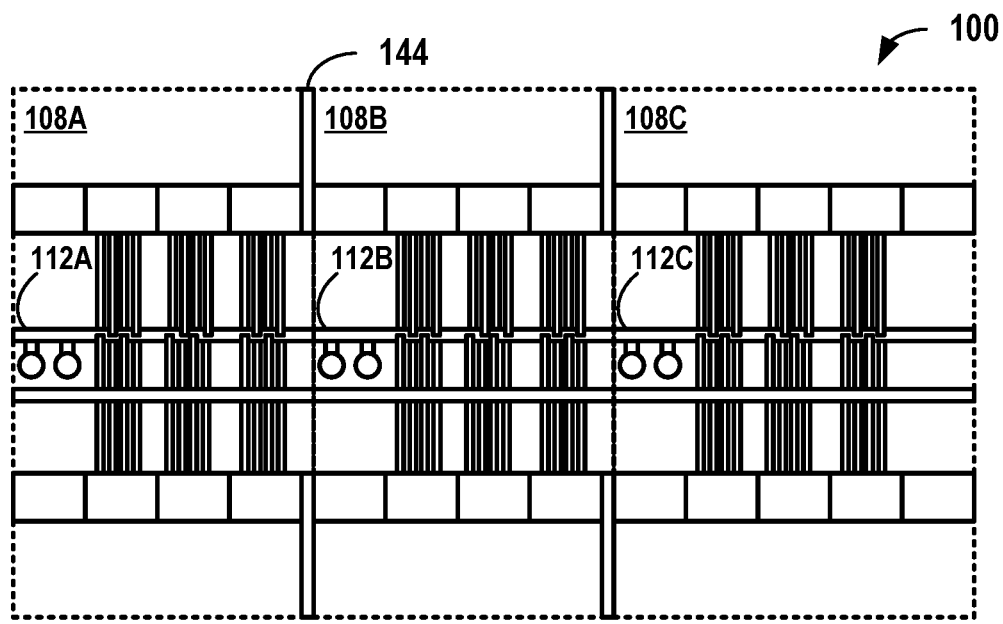
FIG. 4B is a conceptual diagram illustrating a top view of three example horizontally connected sections of a cooling spine of a data hall, in accordance with one or more aspects of the present disclosure.

FIG. 4B is a conceptual diagram illustrating a top view of three example horizontally connected sections of cooling spine 108A, 108B, and 108C, in accordance with one or more aspects of the present disclosure. In the example of FIG. 4B, section of cooling spine 108A includes manifold module 112A, section of cooling spine 108B includes manifold module 112B, and section of cooling spine 108C includes manifold module 112C. Manifold modules 112A, 112B, and 112C are fluidically coupled to each other such that, each manifold module 112 may have a relatively equal pressure without additional pressure control valves.

As more rows of cabinets 103 are installed into data center 100, additional sections of cooling spine 108 may be fluidically coupled to horizontally adjacent sections of cooling spine 108 or to vertically adjacent sections of other cooling spines. In this way, a cooling capacity of a data center may scale with expansion of a rows of cabinets 103 of the data center.

In some examples, the first level of data center 100A may include a data hall firewall module 144 located in one or more data halls 102 and positioned perpendicular to the array of cooling units to divide the data hall into at least two independent fire zones. For example, data hall firewall module 144 may divide section of cooling spine 108A, and corresponding hot aisle and cold aisles, from section of cooling spine 108B and corresponding hot and cold aisles.

Figure 5:
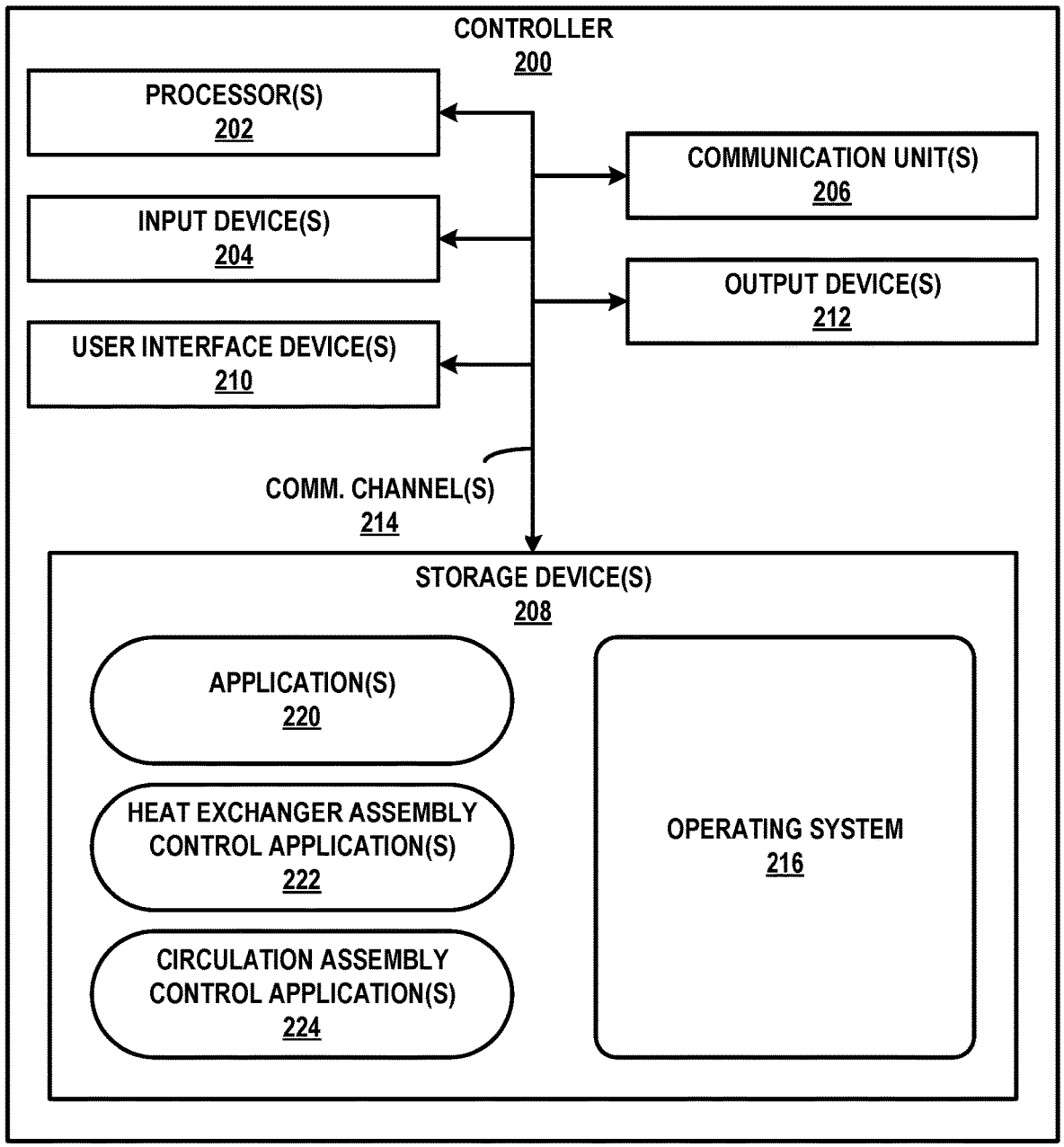
FIG. 5 is a block diagram illustrating an example controller configured to control cooling for a row of cabinets in a data hall, in accordance with one or more aspects of the present disclosure.

Data center cooling systems discussed herein may be configured to cool cabinets using a special purpose computing device, such as a controller. FIG. 5 is a block diagram illustrating an example controller configured to control cooling for a row of cabinets in a data hall, such as row of cabinets 103I and 103J illustrated in FIG. 1B. Controller 200 may include a server or other computing device that includes one or more processor(s) 202 for executing heat exchanger assembly control application(s) 222 and/or circulation assembly control application(s) 224, although controller 200 may be leveraged for other purposes in data center 100 as well. Although shown in FIG. 5 as a stand-alone controller 200 for purposes of example, a computing device may be any component or system that includes one or more processors or other suitable computing environment for executing software instructions.

As shown in FIG. 5, controller 200 includes one or more processors 202, one or more input devices 204, one or more communication units 206, one or more output devices 212, one or more storage devices 208, one or more user interface (UI) devices 210, and communication unit 206. Controller 200 includes one or more applications 222, heat exchanger assembly control application 222, circulation assembly control application 224, and operating system 216 that are executable by controller 200. Each of components 202, 204, 206, 208, 210, and 212 are coupled operatively for inter-component communications. In some examples, communication channels 214 may include a system bus, a network connection, an inter-process communication data structure, or any other method for communicating data. Communication may be via one or more communication protocols including ModBus, BacNET, proprietary DDC or PLC manufacturer's protocol, PCI, or an open protocol. Controller 200 may be located and execute, for example, within data center 100 or at another location, such as on an array of cooling units 114 as power module 140 illustrated in FIG. 3A.

Processors 202 may be configured to implement functionality and/or process instructions for execution within controller 200, such as instructions stored in storage device 208. Examples of processors 202 may include, any one or more of a microprocessor, a controller, a digital signal processor (DSP), an application specific integrated circuit (ASIC), a field-programmable gate array (FPGA), or equivalent discrete or integrated logic circuitry.

One or more storage devices 208 may be configured to store information within controller 200 during operation. Storage device 208, in some examples, is described as a (non-transitory) computer-readable storage medium. In some examples, storage device 208 is a temporary memory, meaning that a primary purpose of storage device 208 is not long-term storage. Storage device 208, in some examples, includes volatile memory, meaning that storage device 208 does not maintain stored contents when the computer is turned off. Examples of volatile memories include random access memories (RAM), dynamic random-access memories (DRAM), static random-access memories (SRAM), and other forms of volatile memories known in the art. In some examples, storage device 208 is used to store program instructions for execution by processors 202. Storage device 208 in one example, is used by software or applications running on controller 200 to temporarily store information during program execution. Storage devices 208 may further be configured for long-term storage of information. In some examples, storage devices 208 include non-volatile storage elements. Examples of such non-volatile storage elements include magnetic hard discs, optical discs, floppy disks, Flash memories, or forms of electrically programmable memories (EPROM) or electrically erasable and programmable (EEPROM) memories.

Controller 200, in some examples, also includes one or more communication units 206. Controller 200, in one example, utilizes communication units 206 to communicate with external devices via one or more networks, such as one or more wired/wireless/mobile networks, etc. Communication units 206 may include a network interface card, such as an Ethernet card, an optical transceiver, a radio frequency transceiver, or any other type of device that can send and receive information. Other examples of such network interfaces may include 3G, 4G and Wi-Fi radios.

In some examples, controller 200 may use communication unit 206 to communicate with one or more devices of a cooling spine 108 configured to provide cooling to cabinets of data center 100. For example, communication unit 206 may be communicatively coupled to control valves of riser modules 110 and manifold modules 112, power supplies of manifold modules 112, liquid cooling systems coupled to riser modules 110 or manifold modules 112, heat exchanger assemblies 124, and/or circulation assemblies 126, and configured to receive measurements from components of cooling spine 108 and send control signals to components of cooling spine 108. For example, communication unit 206 may receive supply air temperature measurements and return air temperature measurements from temperature sensors in or adjacent to cabinets of rows of cabinets 103, cold aisles 104, hot aisles 106, heat exchanger and/or assemblies 124; cooling liquid temperature and/or flow rate measurements from manifold modules 112; and the like. As another example, communication unit 206 may send control signals to control valves of manifold modules 112 to control the flow rate of liquid cooling to heat exchanger assemblies 124, send control signals to circulation assemblies 126 to control a flow rate of supply air to cold aisles 104; and the like.

In some examples, controller 200 may use communication unit 206 to communicate with another controller of cooling spine 108, such as a controller of an adjacent section of cooling spine 108, to receive return air temperatures from adjacent hot aisles. For example, while a controller may control one circulation assembly 126 to a cold aisle 104 and one heat exchanger assembly 124 from a hot aisle 106, the cold aisle 104 may supply air to two different hot aisles 106. As such, the controller may receive return air measurements from two different hot aisles 106 and control the circulation assembly 126 to maintain differential temperatures across both hot aisles 106.

In some examples, controller 200 may use communication unit 206 to communicate with an external device, such as a controller for a liquid cooling system, a data transfer system and/or an electrical power system. In some examples, communication unit(s) 206 and input device(s) 204 may be operatively coupled to controller 200. For example, controller 200 may receive a communication from an analog input device indicating an amperage, voltage, or other signal at the input device. Depending on implementation, digital signaling techniques, analog signaling techniques, or any combination thereof, may be used by controller 200 for the purpose of controlling a flow rate of supply air to cold aisles 104 or liquid cooling to heat exchanger assemblies 124, in accordance with the disclosure.

Controller 200 may include one or more user interface devices 210. User interface devices 210 may be configured to receive input from a user through tactile, audio, or video feedback. Examples of user interface devices(s) 210 include a presence-sensitive display, a mouse, a keyboard, a voice responsive system, video camera, microphone or any other type of device for detecting a command from a user. In some examples, a presence-sensitive display includes a touch-sensitive screen.

One or more output devices 212 may also be included in controller 200. Output device 212, in some examples, is configured to provide output to a user using tactile, audio, or video stimuli. Output device 212, in one example, includes a presence-sensitive display, a sound card, a video graphics adapter card, or any other type of device for converting a signal into an appropriate form understandable to humans or machines. Additional examples of output device 212 include a speaker, a liquid crystal display (LCD), or any other type of device that can generate intelligible output to a user.

Controller 200 may include operating system 216. Operating system 216, in some examples, controls the operation of components of controller 200. For example, operating system 216, in one example, facilitates the communication of one or more applications 220, heat exchanger assembly control application 222, and circulation assembly control application 224 with processors 202, communication unit 206, storage device 208, input device 204, user interface devices 210, and output device 212.

Application 220, heat exchanger assembly control application 222, and circulation assembly control application 224 may also include program instructions and/or data that are executable by controller 200. Heat exchanger assembly control application 222 and circulation assembly control application 224 may include instructions for causing a special-purpose computing device to perform one or more of the operations and actions described in the present disclosure with respect to controller 200.

As one example, heat exchanger assembly control application 222 may include instructions that cause processor(s) 202 of controller 200, equivalently controller 200 itself, to control heat exchanger assemblies 124 to cool return air from hot aisle 106. For example, heat exchanger assembly control application 222 may be configured to cause one or more control valves of manifold module 112 to control a flow rate of cooling liquid to heat exchanger assemblies 124. Heat exchanger assembly control application 222 may be configured to receive temperature measurements, or measurements of variables related to a temperature or degree of cooling, from an outlet of a heat exchanger assembly 124 and control a flow of cooling liquid to the respective heat exchanger assembly 124 to maintain the temperature measurement of the outlet of the respective heat exchanger assembly 124 below a threshold.

As another example, circulation assembly control application 224 may include instructions that cause processor(s) 202 of controller 200, equivalently controller 200 itself, to control circulation assemblies 126 to discharge supply air into cold aisle 104. For example, circulation assembly control application 224 may be configured to cause one or more control circuits of a circulation assembly 126 to control a speed of circulation devices of the circulation assembly 126. Circulation assembly control application 224 may be configured to receive temperature measurements, or measurements of variables related to a temperature or degree of cooling, from an outlet of a cabinet of a row of cabinets 103 and control a speed of circulation devices of the respective circulation assembly 126 to maintain the outlet of the respective row of cabinets 103 below a threshold.

Controller 200 may be configured to maintain adequate cooling to cabinets.

Figure 6:
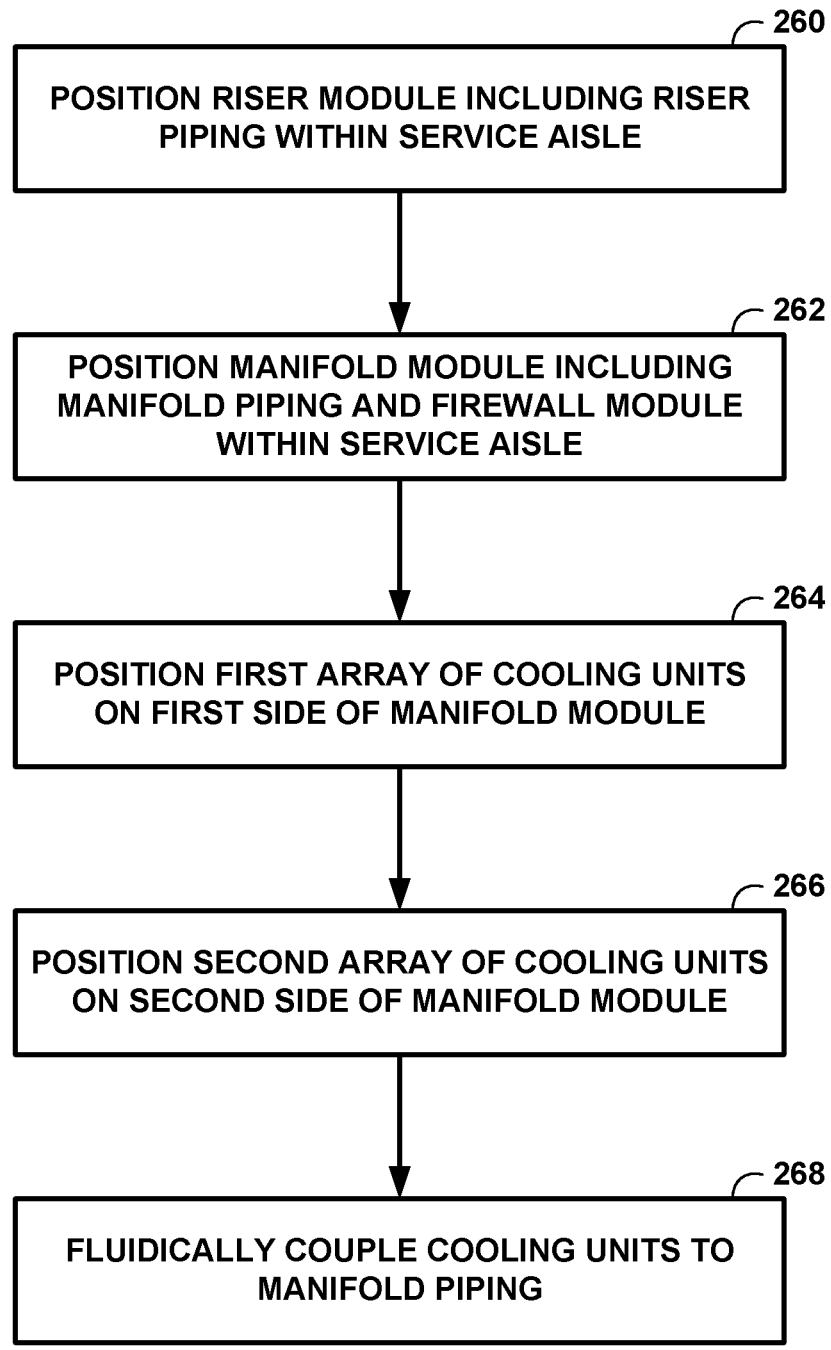
FIG. 6 is a flow diagram of an example technique for assembling an example section of a cooling spine of a data center cooling system, in accordance with one or more aspects of the present disclosure.

FIG. 6 is a flow diagram of an example technique for assembling an example section of a cooling spine 108 of a data center cooling system, in accordance with one or more aspects of the present disclosure. The example technique of FIG. 6 will be described with respect to section of cooling spine 108A of FIGS. 2A and 2B. A technician may position riser module 110A that includes riser piping 116A and 116B within a service aisle (260). For example, the technician may mechanically couple at least one end of each of riser supply piping 116A and riser return piping 116B to a vertically adjacent riser supply piping and riser return piping. A technician may position a manifold module 112A that includes manifold piping within the service aisle and a firewall module 128A within the service aisle (262). Firewall module 128A may be prefabricated and positioned along a center of spine adjacent to riser piping 116A and 116B, and may carry power supply to an opposite side of cooling spine 108A. A technician may position a first array of cooling units on a first side of the manifold module (264). A technician may position a second array of cooling units on a second side of the manifold module (266). A technician may fluidically couple cooling units to the manifold module (268).

In some examples, rather than discharge air directly into an adjacent cold aisle 104, systems described herein may discharge cooled supply air into an upper volume of a data hall. FIGS. 7-9 describe systems that incorporate an upper level discharge of supply air into a cooling system. Unless otherwise indicated, components of FIGS. 7-9 may be structurally and functionally similar to similarly named components of FIGS. 1-3.

Figure 7A:
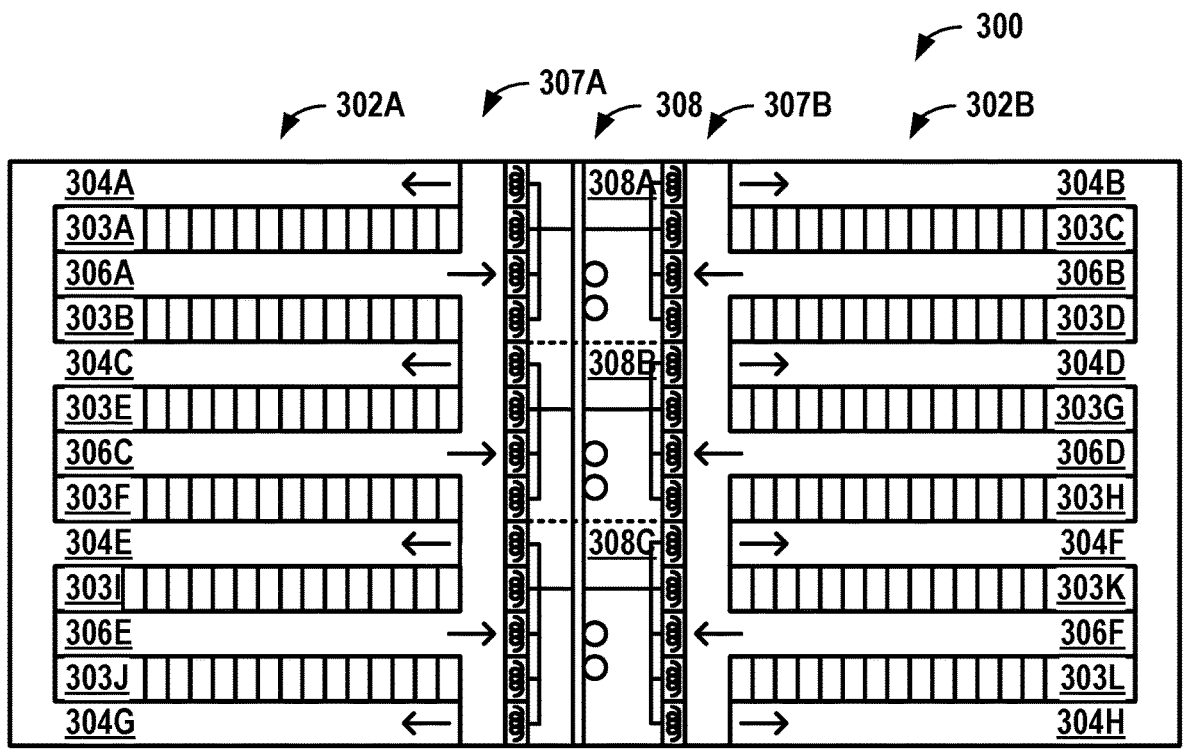
FIG. 7A is a conceptual diagram illustrating a top view of a lower level of an example data center, in accordance with one or more aspects of the present disclosure.

FIG. 7A is a conceptual diagram illustrating a top view of a lower level of an example data center 300, in accordance with one or more aspects of the present disclosure. In the example of FIG. 7A, data hall 302A includes four cold aisles 304A, 304C, 304E, and 304G and data hall 302B includes four cold aisles 304B, 304D, 304F, and 304H; each set of cold aisles may be joined by a common aisle opposite cooling spine 308. Each cold aisle 304 is configured to receive cooled supply air from cooling spine 308 via an upper volume and provide the cooled supply air to adjacent rows of cabinets 303 of the respective cold aisle 304. In the example of FIG. 7A, data hall 302A includes three joined hot aisles 306A, 306C, and 306E and data hall 302B includes three joined hot aisles 306B, 306D, and 306F; each set of hot aisles may be joined by a common aisle adjacent cooling spine 308. Each hot aisle 306 is configured to receive warm return air from adjacent rows of cabinets of the respective hot aisle 306 and discharge the warm return air to cooling spine 308.

Figure 7B:
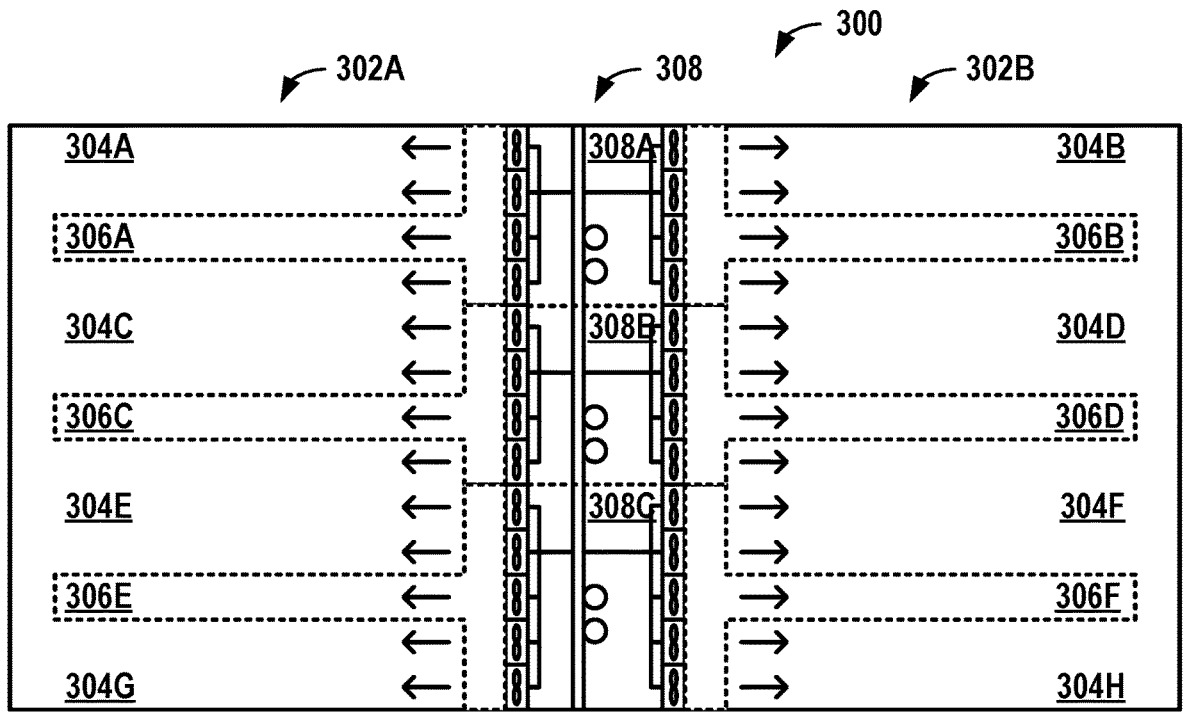
FIG. 7B is a conceptual diagram illustrating a top view of an upper level of the example data center of FIG. 7A, in accordance with one or more aspects of the present disclosure.

Each data hall 302A and 302B includes an upper volume. FIG. 7B is a conceptual diagram illustrating a top view of an upper level of the data center 300 of FIG. 7A, in accordance with one or more aspects of the present disclosure. In the example of FIG. 7B, data halls 302A and 302B include upper volumes. Each section of cooling spine 308 is configured to discharge cooled supply air to an adjacent upper volume of a data hall 302A or 302B and down to a cold aisle 304 to cool one or more rows of cabinets 303 adjacent the respective cold aisle 304. Each upper volume of data hall 302 is configured to receive cooled supply air from cooling spine 308 and discharge cooled supply air to one or more cold aisles 304 fluidically coupled to the upper volume within the respective data hall 302. For example, the upper volume of data hall 302A is configured to discharge cooled supply air to cold aisles 304A, 304C, 304E, and 304G.

Figure 7C:
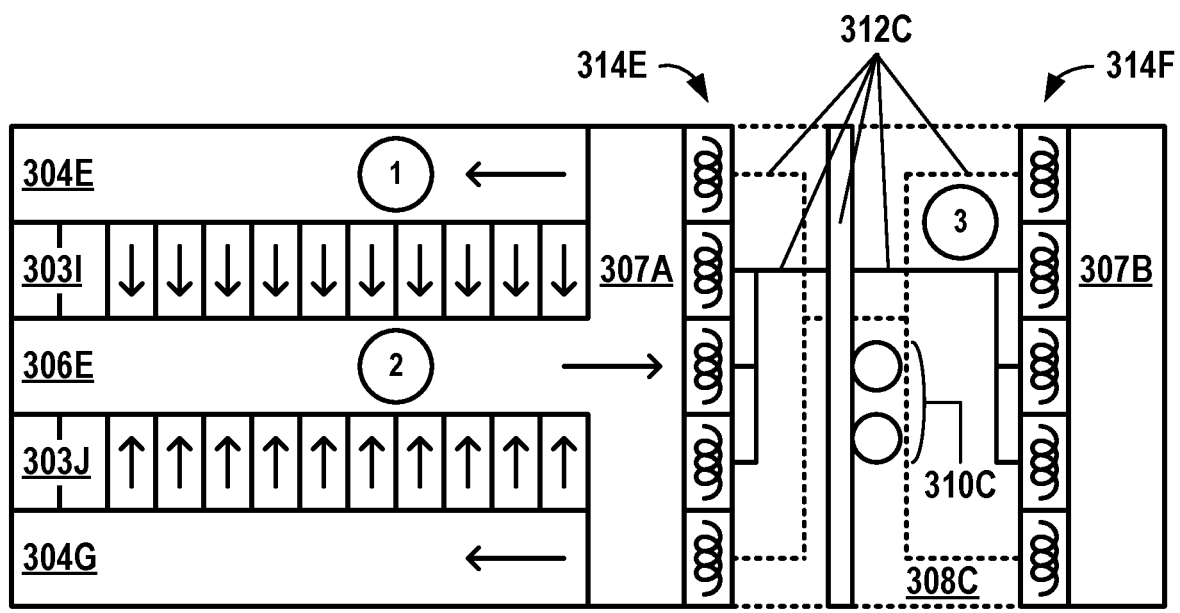
FIG. 7C is a conceptual diagram illustrating a top view of an example section of the data center of FIGS. 7A and 7B, in accordance with one or more aspects of the present disclosure.
Figure 7D:
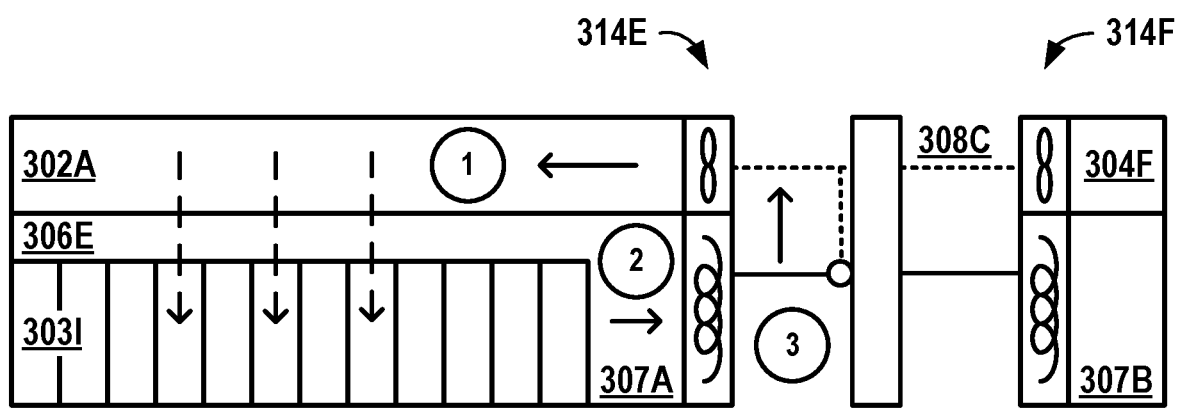
FIG. 7D is a conceptual diagram illustrating a side view of the example section of FIG. 7C, in accordance with one or more aspects of the present disclosure.

FIG. 7C is a conceptual diagram illustrating a top view of a lower level of an example section of data halls 302A and 302B of FIGS. 7A and 7B, while FIG. 7D is a conceptual diagram illustrating a side view of the example section of FIG. 7C, in accordance with one or more aspects of the present disclosure. Each array of cooling units 314 may include one or more circulation assemblies configured to discharge cooled supply air from cooling spine 308 into adjacent cold aisles 304 via an adjacent upper volume and draw warmed return air from an adjacent hot aisle 306 into cooling spine 308. For example, array of cooling units 314E may include circulation assemblies configured to discharge supply air from section of cooling spine 308C into a volume above cold aisles 304E and 304G and cabinets 303I and 303J, and contained hot aisle 306E, and down into cold aisles 304E and 304G, and draw warmed return air from hot aisle 306E via a common hot aisle through heat exchanger assemblies of array of cooling units 314 into section of cooling spine 308C. Each data hall 302A and 302B may be pressurized via the one or more circulation assemblies to a pressure. For example, the one or more circulation assemblies may discharge cooled supply air into an upper volume of data hall 302A. Each array of cooling units 314 includes one or more heat exchanger assemblies configured to cool warmed return air from a hot aisle 306 of data halls 302A and 302B and discharge the cooled return air into cooling spine 308 as cooled supply air. For example, array of cooling units 314E may include heat exchanger assemblies configured to cool warmed return air from hot aisle 306E and discharge the cooled return air into section of cooling spine 308.

In the example of FIG. 7C, section of cooling spine 308C is illustrated cooling rows of cabinets 303I and 303J. For purposes of illustration, cold aisles 304E and 304G are at conditions 1 (indicated by labeled circle "1") that includes a supply air pressure P1 and a supply air temperature T1; hot aisle 306E is at conditions 2 (indicated by labeled circle "2") that includes a return air pressure P2 and a return air temperature T2; and section of cooling spine 308C is at conditions 3 (indicated by labeled circle "3") that includes a spine air pressure P3 and a spine air temperature T3.

Circulation assemblies of array of cooling units 314C discharge cooled supply air to the upper volume of data hall 302A at supply air pressure P1. The cooled supply air may flow above cold aisles 304E and 304G, cabinets 303I and 303J, and contained hot aisle 306E, and down into cold aisles 304E and 304G at supply air pressure P1. Supply air pressure P1 may correspond to a particular amount (e.g., flow rate) of supply air to row of cabinets 303I and 303J to maintain a differential temperature across row of cabinets 303F (in adjacent section 308B), 303I, and 303J. Row of cabinets 303I may have a different heat load than row of cabinets 303J or 303F, such that the particular amount of supply air to maintain row of cabinets 303I at the temperature differential may be different than the particular amount of supply air to maintain row of cabinets 303J at the temperature differential. In some examples, pressure differential may be used as an interlock for an override condition. For example, a breach of containment may cause a low temperature differential, which may cause the cooling assemblies to reduce a flow rate of supply air without an interlock. A low pressure differential may indicate the containment breach, such that the circulation assemblies may not be controlled by the low temperature differential.

The cooled supply air may flow through the rows of cabinets 303I and 303J into hot aisle 306E at least partially due to respective pressure differentials between supply air pressure P1 and return air pressure P2. For example, hot aisle 306E may have a return air pressure P2 that is less than supply air pressure P1 of adjacent cold aisles 304I and 304J. A flow of cooled supply air through the rows of cabinets 303I and 303J may be proportional to the respective pressure differential across the respective rows of cabinets 303I and 303J. As the supply air flows through the cabinets of the rows of cabinets 303I and 303J, the supply air removes heat from the cabinets of the rows of cabinets 303I and 303J and increases in temperature. As a result, the warmed return air temperature T2 is higher than the cooled supply air temperature T1.

Circulation assemblies of array of cooling units 314E draw warmed return air from hot aisle 306E through heat exchanger assemblies of array of cooling units 314E. For example, section of cooling spine 308C may have a spine air pressure P3 that is less than the return air pressure P2 of hot aisle 306E, such that the heated return air flows from hot aisle 306E through the heat exchanger assemblies of array of cooling units 314E. Array of cooling units 314E cools return air from hot aisle 306E and discharges the cooled return air into a volume of the section of cooling spine 308C. The heat exchanger assemblies of array of cooling units 314E may receive cooling liquid from manifold module 312C, remove heat from the warmed return air using the cooling liquid, and discharge warmed cooling liquid to manifold module 312C. A flow of cooling liquid to and from the heat exchanger assemblies of array of cooling units 314E may be selected to supply a particular amount of cooling liquid to cool hot aisle 306E. As a result, spine air temperature T3 is lower than return air temperature T2.

Figure 7E:
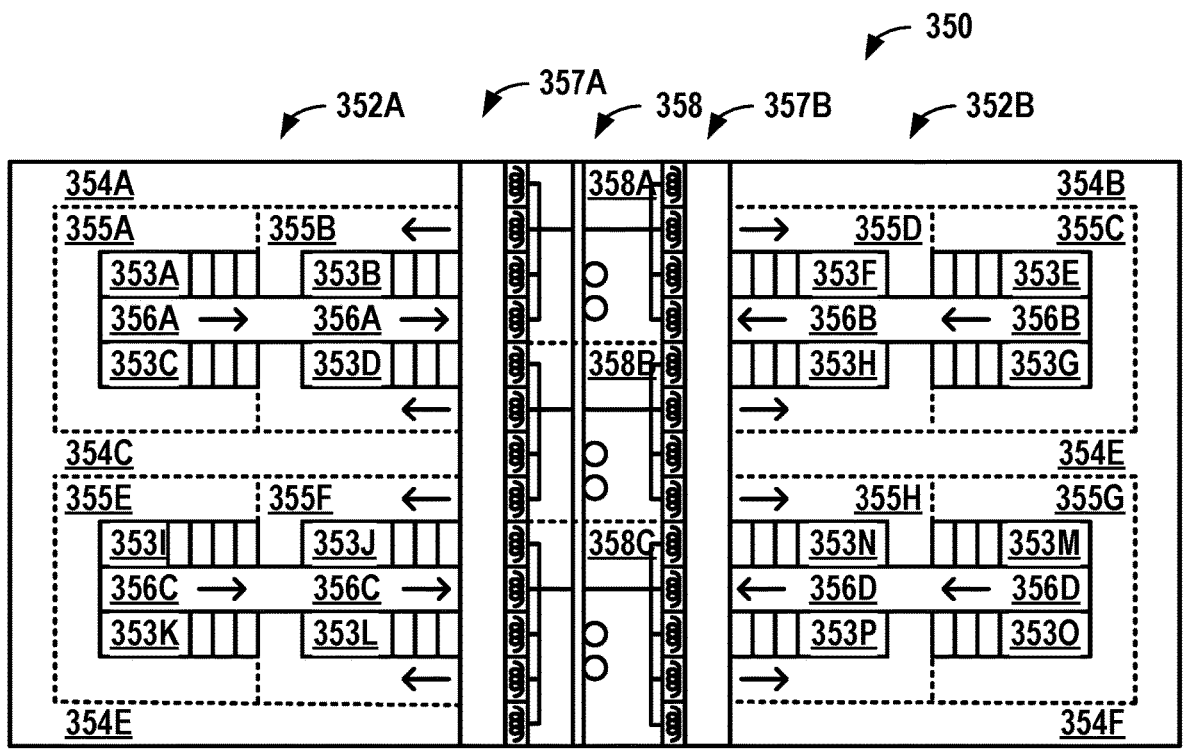
FIG. 7E is a conceptual diagram illustrating a top view of a lower level of an example data center, in accordance with one or more aspects of the present disclosure.

In some examples, a data hall may include smaller subdivisions of rows of cabinets. For example, in a retail data center, customers may not require an entire pair of rows of cabinets. Data centers described herein may provide a flexible footprint to accommodate such smaller subdivision of cabinets. For example, as well be described in FIGS. 7E-7H, data centers may have configurable of rows sizes (e.g., lengths of sections of rows and/or widths between rows) along a cooling spine. FIG. 7E is a conceptual diagram illustrating a top view of a lower level of an example data center 350, in accordance with one or more aspects of the present disclosure. Each data hall 352 in data center 350 may be arranged as a common data hall volume functioning as cold aisles 354 and contained aisles within the common data hall volume functioning as hot aisles 356. In the example of FIG. 7E, a data hall 352A includes three cold aisles 354A, 354C, and data hall 352B includes three cold aisles 354B, 354D, and 354F. Each cold aisle 354 is configured to receive cooled supply air from cooling spine 358 via an upper volume above rows cabinets 353 and hot aisles 356, and provide the cooled supply air to adjacent rows of cabinets 353 of the respective cold aisles 354.

In contrast to data halls 302 of FIG. 7A, in which rows of cabinets 303 span a respective data hall 302, data center 350 includes rows of cabinets 353 that are subdivided into smaller rows and contained in separates cages 355. For example, a smaller customer may wish to maintain physical custody of cabinets and ensure privacy, such as through opaque sheets. In the example of FIG. 7E, data hall 352A includes four cages 355A, 355B, 355E, and 355F housing respective rows of cabinets 353A/C, 353B/D, 353I/K, and 353J/L, while data hall 352B includes four cages 355C, 355D, 355G, and 355H housing respective rows of cabinets 353E/F, 353G/H, 353M/O, and 353N/P. However, even though rows of cabinets may be separate along a width of data hall 352A and 352B, a common hot aisle 356 may draw warmed air into cooling spine 358 via a respective common hot aisle 357

In the example of FIG. 7E, data hall 352A includes two hot aisles 356A and 356C joined by a common hot aisle 357A adjacent cooling spine 358, and data hall 352B includes two hot aisles 356B and 356D joined by a common hot aisle 357B adjacent cooling spine 358. Each hot aisle 356 is configured to receive warm return air from adjacent rows of cabinets of the respective hot aisle 356 and discharge the warm return air to cooling spine 358 via common aisles 357. In this way, data center 350 may permit a variety of configurations of cabinets while maintaining efficient removal of warmed air to cooling spine 358.

Figure 7F:
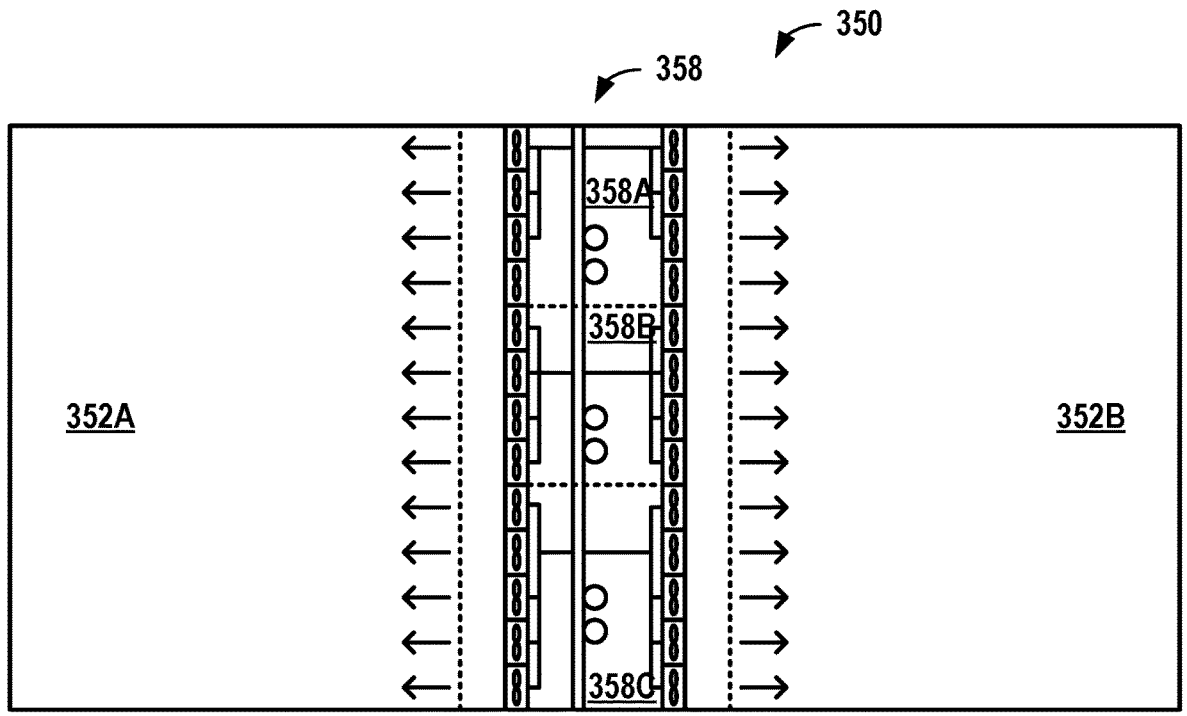
FIG. 7F is a conceptual diagram illustrating a top view of an upper level of the example data center of FIG. 7E, in accordance with one or more aspects of the present disclosure.

Each data hall 352A and 352B includes an upper volume to supply cooled supply air to cabinets within the respective data hall 352. FIG. 7F is a conceptual diagram illustrating a top view of an upper level of the data center 350 of FIG. 7E, in accordance with one or more aspects of the present disclosure. Each section of cooling spine 358 is configured to discharge cooled supply air to an adjacent upper volume of data hall 352A or 352B and down to a cold aisle 354 to cool one or more rows of cabinets 353 adjacent the respective cold aisle 354. Each upper volume of data hall 352 is configured to receive cooled supply air from cooling spine 358 and discharge cooled supply air to one or more cold aisles 354 fluidically coupled to the upper volume within the respective data hall 352. For example, the upper volume of data hall 352A is configured to discharge cooled supply air to cold aisles 354A, 354C, and 354E.

Figure 7G:
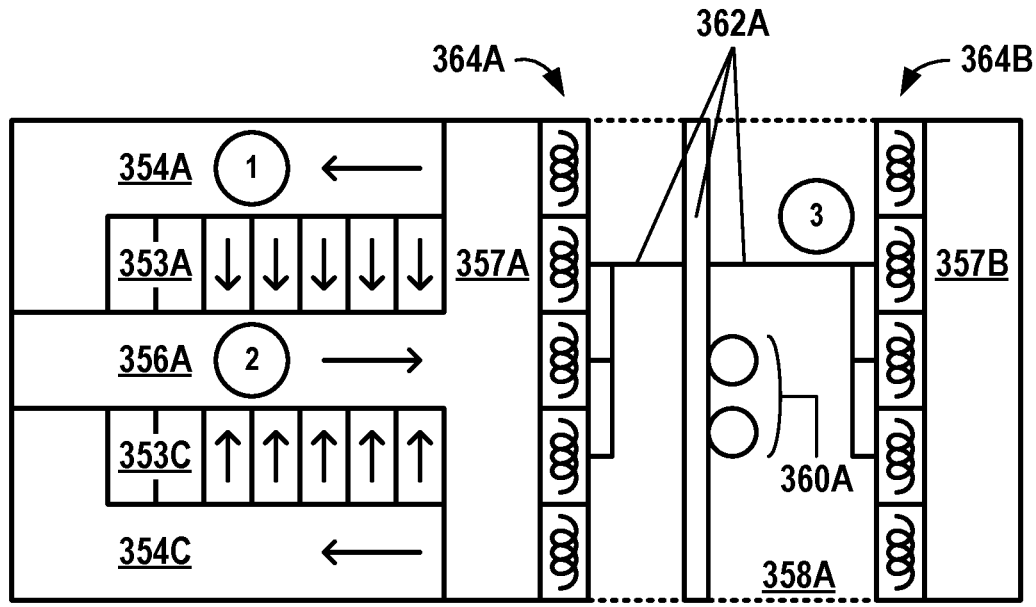
FIG. 7G is a conceptual diagram illustrating a top view of an example section of the data center of FIGS. 7E and 7F, in accordance with one or more aspects of the present disclosure.
Figure 7H:
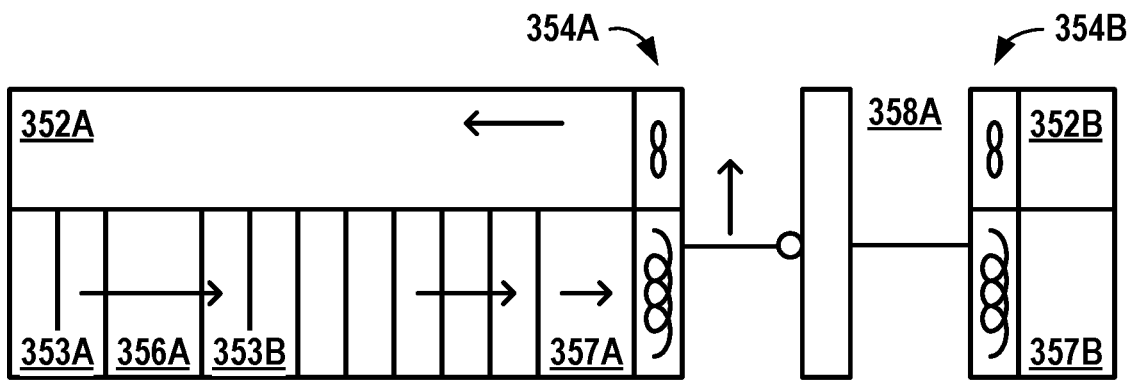
FIG. 7H is a conceptual diagram illustrating a side view of the example section of FIG. 7G, in accordance with one or more aspects of the present disclosure.

FIG. 7G is a conceptual diagram illustrating a top view of a lower level of an example section of data halls 352A and 352B of FIGS. 7E and 7F, while FIG. 7H is a conceptual diagram illustrating a side view of the example section of FIG. 7G, in accordance with one or more aspects of the present disclosure. Operation of data halls 352A and 352B as shown in FIGS. 7G and 7H may be similar to operation of data halls 302A and 302B of FIGS. 7C and 7D. However, hot aisles 356 may be horizontal and continuous to permit returning warmer air to flow from more distal rows of cabinets 353. For example, warmer return air may flow from cabinets 353A along hot aisle 356A to combine with warmer return air from cabinets 353B. In this way, upper volume of each data hall 352 may accommodate cooling units 364 along substantially all of spine 358, for a correspondingly high cooling capacity.

Figure 7I:
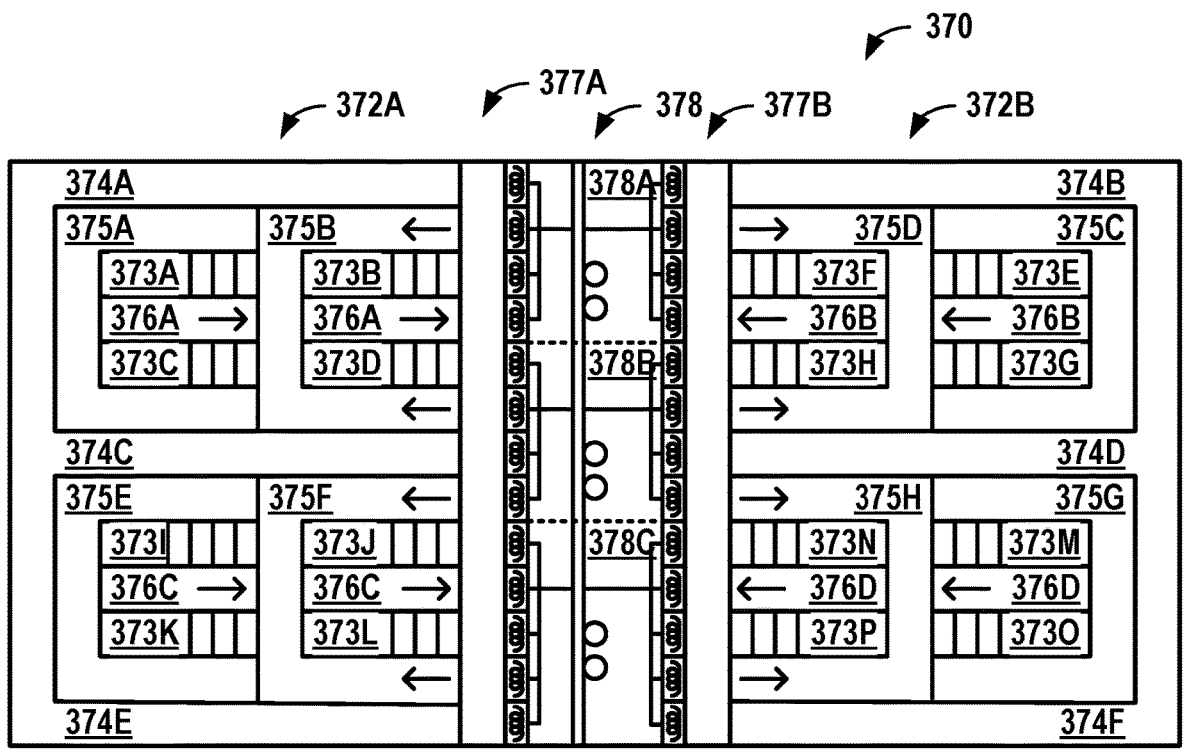
FIG. 7I is a conceptual diagram illustrating a top view of a lower level of an example data center, in accordance with one or more aspects of the present disclosure.

In some examples, a data hall may include private subdivisions of rows of cabinets. For example, in a retail data center, customers may desire physical and visual privacy of equipment. Data centers described herein may provide a contained form factor to accommodate such private subdivision of cabinets. For example, as well be described in FIGS. 7I-7L, data centers may have configurable rows sizes (e.g., lengths of sections of rows and/or widths between rows) along a cooling spine that may be further contained by opaque walls. FIG. 7I is a conceptual diagram illustrating a top view of a lower level of an example data center 370, in accordance with one or more aspects of the present disclosure. Each data hall 372 in data center 370 may be arranged as a common data hall volume functioning as cold aisles 374 and contained aisles within the common data hall volume functioning as hot aisles 376. In the example of FIG. 7I, a data hall 372A includes three cold aisles 374A, 374C, and 374E, and data hall 372B includes three cold aisles 374B, 374D, and 374F. Each cold aisle 374 is configured to receive cooled supply air from cooling spine 378 via an upper volume above rows cabinets 373 and hot aisles 376, and provide the cooled supply air to adjacent rows of cabinets 373 of the respective cold aisles 374.

In contrast to data halls 302 of FIG. 7E, in which rows of cabinets 303 span a respective data hall 302, data center 370 includes rows of cabinets 373 that are subdivided into smaller rows and contained in separates cages 375. For example, a smaller customer may wish to maintain physical custody of cabinets and ensure privacy, such as through opaque sheets. In the example of FIG. 7I, data hall 372A includes four cages 375A, 375B, 375E, and 375F housing respective rows of cabinets 373A/C, 373B/D, 373I/K, and 373J/L, while data hall 372B includes four cages 375C, 375D, 375G, and 375H housing respective rows of cabinets 373E/F, 373G/H, 373M/O, and 373N/P. However, even though rows of cabinets may be separate along a width of data hall 372A and 372B, a common hot aisle 376 may draw warmed air into cooling spine 378 via a respective common hot aisle 377.

In the example of FIG. 7I, data hall 372A includes two hot aisles 376A and 376C joined by a common hot aisle 377A adjacent cooling spine 378, and data hall 372B includes two hot aisles 376B and 376D joined by a common hot aisle 377B adjacent cooling spine 378. Each hot aisle 376 is configured to receive warm return air from adjacent rows of cabinets of the respective hot aisle 376 and discharge the warm return air to cooling spine 378 via common aisles 377. In this way, data center 370 may permit a variety of configurations of cabinets while maintaining efficient removal of warmed air to cooling spine 378.

Each data hall 372A and 372B includes an upper volume to supply cooled supply air to cabinets within the respective data hall 372. FIG. 7L is a conceptual diagram illustrating a top view of an upper level of the data center 370 of FIG. 7I, in accordance with one or more aspects of the present disclosure. Each section of cooling spine 378 is configured to discharge cooled supply air to an adjacent upper volume of data hall 372A or 372B and down to a cold aisle 374 to cool one or more rows of cabinets 373 adjacent the respective cold aisle 374. Each upper volume of data hall 372 is configured to receive cooled supply air from cooling spine 378 and discharge cooled supply air to one or more cold aisles 374 fluidically coupled to the upper volume within the respective data hall 372. For example, the upper volume of data hall 372A is configured to discharge cooled supply air to cold aisles 374A, 374C, and 374E.

Figure 7J:
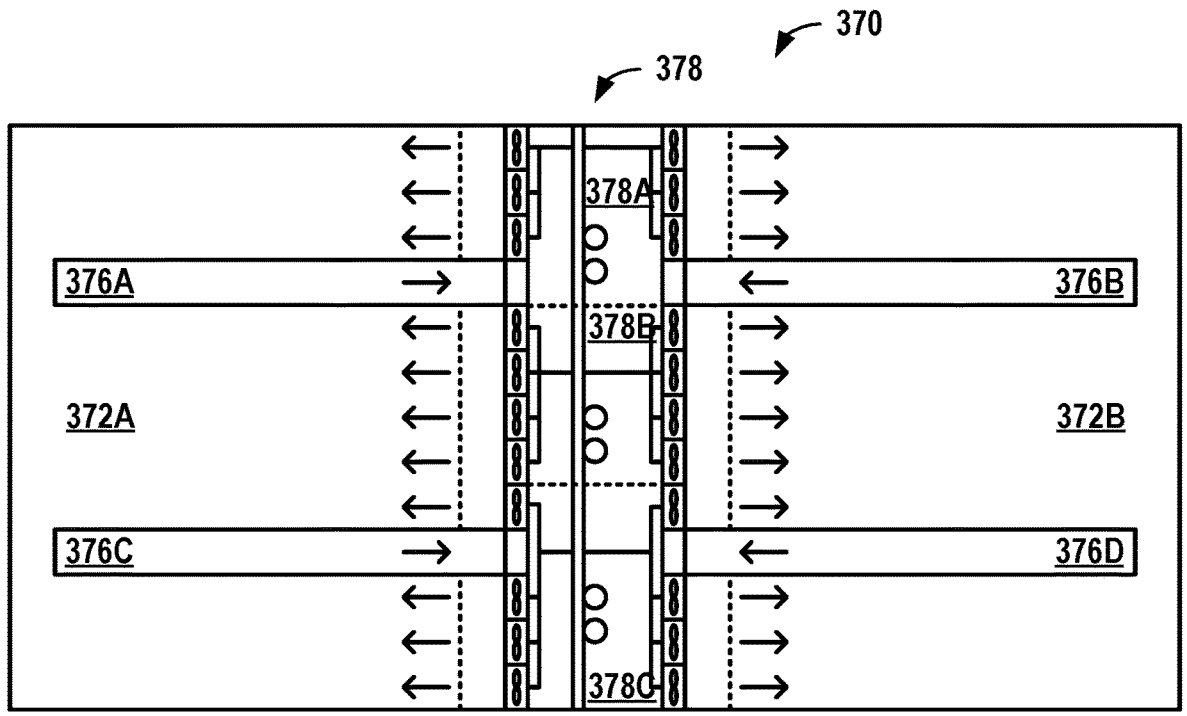
FIG. 7J is a conceptual diagram illustrating a top view of an upper level of the example data center of FIG. 7I, in accordance with one or more aspects of the present disclosure.
Figure 7K:
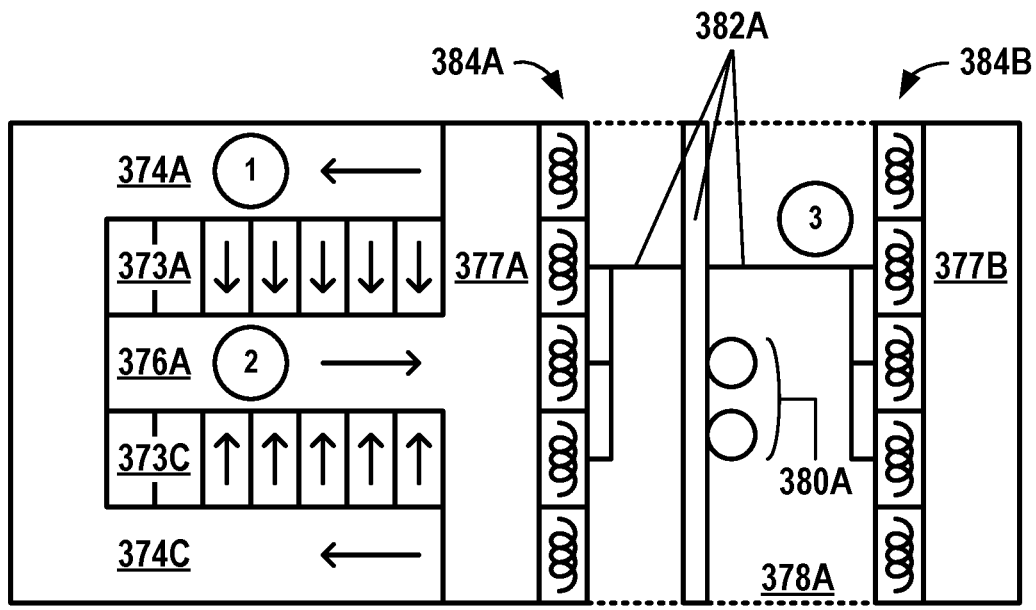
FIG. 7K is a conceptual diagram illustrating a top view of an example section of the data center of FIGS. 7I and 7J, in accordance with one or more aspects of the present disclosure.
Figure 7L:
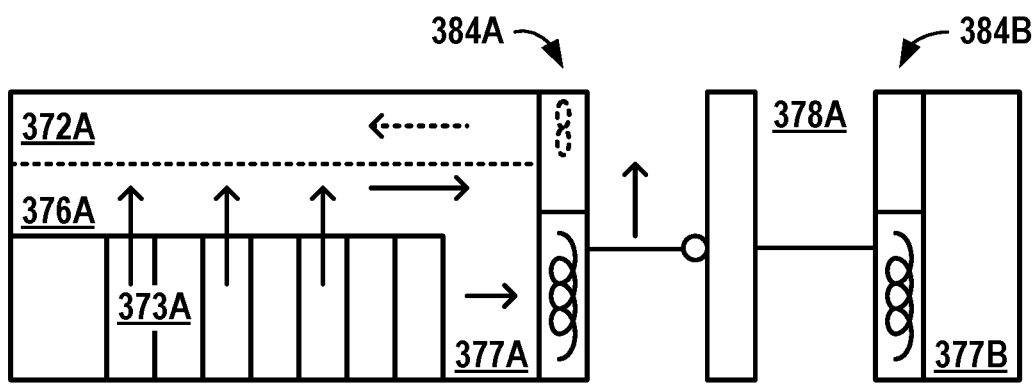
FIG. 7L is a conceptual diagram illustrating a side view of the example section of FIG. 7K, in accordance with one or more aspects of the present disclosure.

FIG. 7K is a conceptual diagram illustrating a top view of a lower level of an example section of data halls 372A and 372B of FIGS. 7I and 7J, while FIG. 7L is a conceptual diagram illustrating a side view of the example section of FIG. 7K, in accordance with one or more aspects of the present disclosure. Operation of data halls 372A and 372B as shown in FIGS. 7G and 7H may be similar to operation of data halls 352A and 352B of FIGS. 7G and 7H. However, hot aisles 376 may have a higher "lid" to create a higher overhead containment for returning warmer air. For example, to accommodate security cages 375, each cage 375 may be separated by opaque walls and a passageway beneath the overhead containment. As a result, warmer air may be drawn first vertically, and then horizontally, to be discharged into common hot aisle 377. For example, as shown in FIG. 7, warmer air may exit into hot aisle 376A from row of cabinets 373A and rise into the overhand containment portion of hot aisle 376A to combine with other air from other rows of cabinets 373 before discharging into common hot aisle 377A to be cooled by array of cooling units 384A.

Figure 8A:
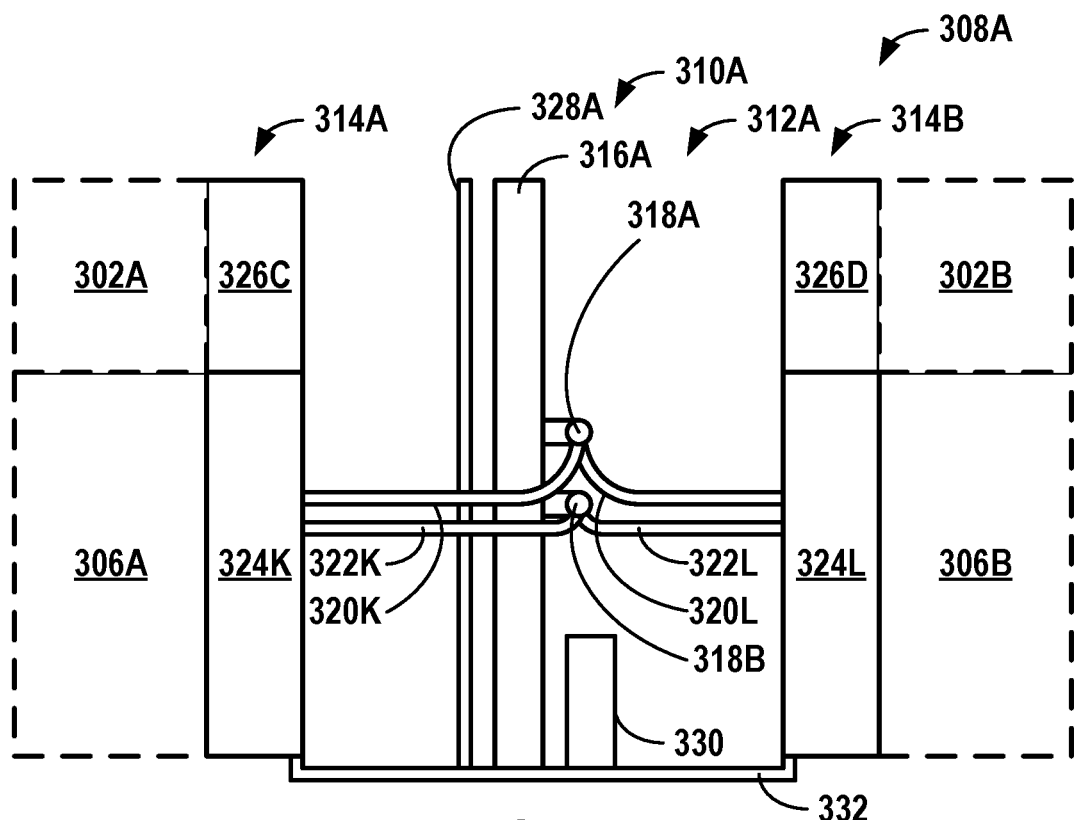
FIG. 8A is a conceptual diagram illustrating a side view of an example section of a cooling spine of a data center cooling system, in accordance with one or more aspects of the present disclosure.
Figure 8B:
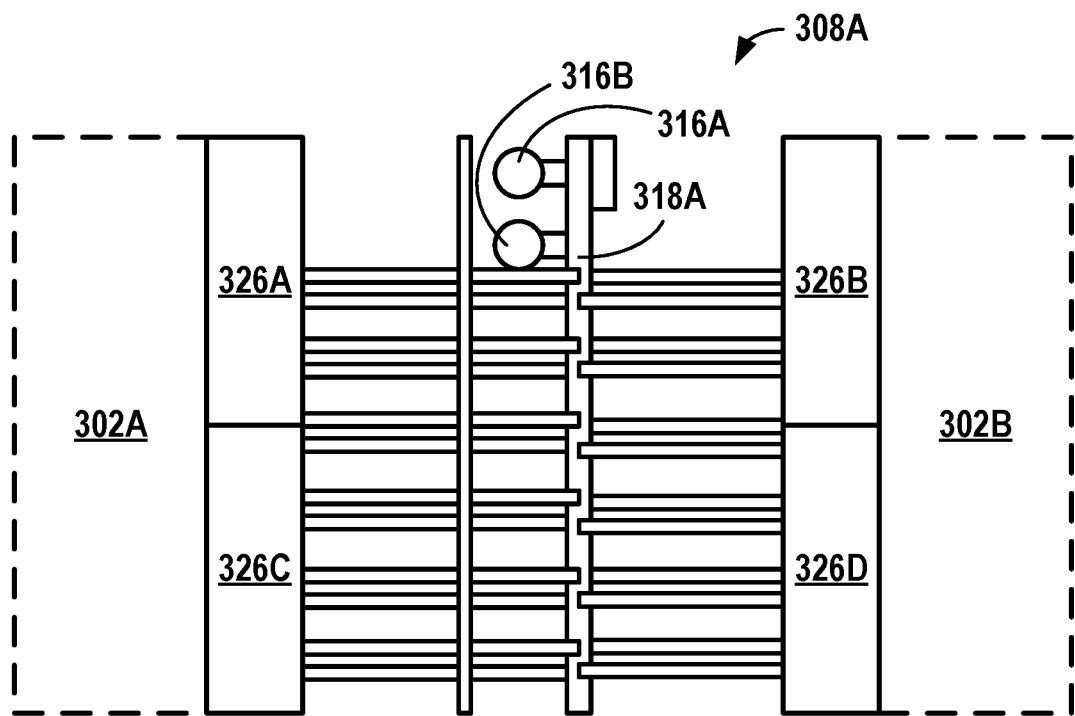
FIG. 8B is a conceptual diagram illustrating a top view of an example section of the cooling spine of FIG. 8A, in accordance with one or more aspects of the present disclosure.
Figure 9:
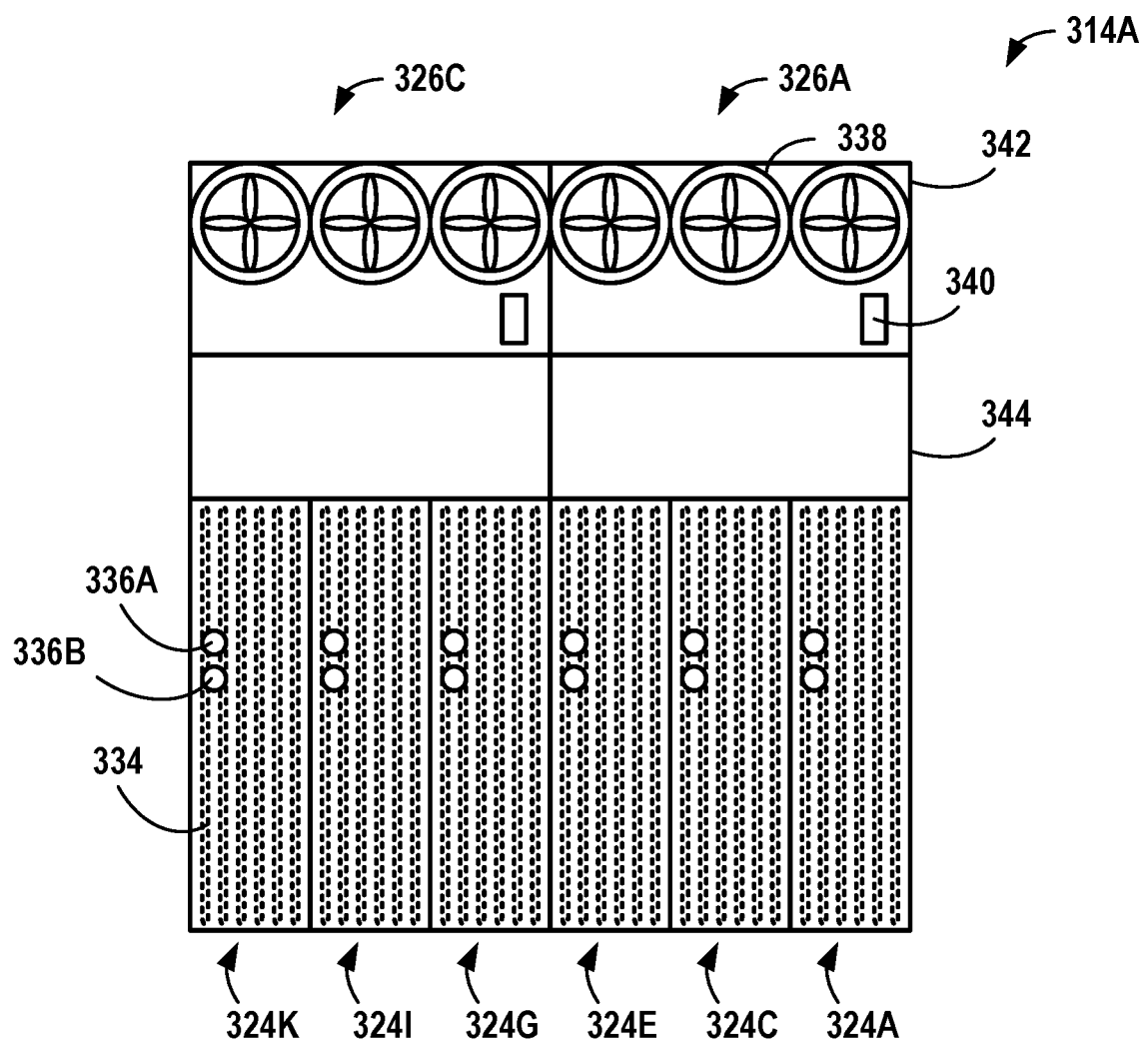
FIG. 9 is a conceptual diagram illustrating a side view of an example array of cooling units, in accordance with one or more aspects of the present disclosure.

FIG. 8A is a conceptual diagram illustrating a side view of an example section of a cooling spine 308A, while FIG. 8B is a conceptual diagram illustrating a top view of example section of the cooling spine 308A of FIG. 8A, in accordance with one or more aspects of the present disclosure.

Each array of cooling units 314 includes one or more heat exchanger assemblies 324 fluidically coupled to manifold unit supply piping 320 and manifold unit return piping 322. Each heat exchanger assembly 324 is configured to receive cooling liquid from manifold unit supply piping 320 and discharge warmed cooling liquid to manifold unit return piping 322. Each heat exchanger assembly 324 is positioned between a respective hot aisle 306 and a respective section of cooling spine 308. In the example of FIGS. 8A and 8B, each heat exchanger assembly 324 is positioned between service aisle 309 and a respective hot aisle 306A or 306B, such that return air drawn into service aisle 309 impinges upon and passes through a heat exchanger assembly 324 of the respective array of cooling units 314A and 314B. Each heat exchanger assembly 324 is configured to cool return air from a respective hot aisle 306 adjacent a row of cabinets 303 by removing heat from the return air into the cooling liquid. Each heat exchanger assembly 324 is configured to discharge the cooled return air to a volume of cooling spine 308 and discharge the warmed cooling liquid back to manifold unit supply piping 320.

Each array of cooling units 314 includes one or more circulation assemblies 326 electrically coupled to power infrastructure. Each circulation assembly 326 is configured to receive power from the power infrastructure. In the example of FIGS. 8A and 8B, each circulation assembly 326 is positioned between service aisle 109 and a respective upper volume of data hall 302A or 302B, such that supply air drawn from the section of cooling spine 308 passes through circulation assembly 326 and discharges into the respective upper volume of data hall 302A or 302B. Each circulation assembly 326 is configured to discharge supply air to a respective cold aisle 304 adjacent a row of cabinets 303 via the respective upper volume of data hall 302A or 302B by creating a positive pressure differential between the section of cooling spine 308 and the respective data hall 302.

In some examples, circulation assemblies 326 may include one or more speed regulators configured to control a flow of supply air to a respective cold aisle 304. For example, the one or more speed regulators may be communicatively coupled to a controller (not shown) and configured to receive control signals from the controller and control a flow of supply air to a respective cold aisle 304 via the upper volume based on the control signals. In some examples, the one or more speed regulators may receive control signals based on a temperature differential between a temperature of return air in hot aisle 306 and a temperature of supply air in cold aisle 304. As an example, if a temperature differential between hot aisle 306A and cold aisle 304A is greater than a temperature differential between hot aisle 306B and cold aisle 304B, circulation assemblies 326A and 326C may receive control signals to control flow of supply air at a first flow rate, while circulation assemblies 326B and 326D may receive control signals to control flow of supply air at a second flow rate that is less than the first flow rate, due to a higher temperature differential between hot aisle 306A and cold aisle 304A.

Each section of cooling spine 308 may include additional support infrastructure configured to support components of the section of cooling spine 308. For example, each section of cooling spine 308 may be modular, such that the section of cooling spine 308 may be standardized and capable of being installed and/or assembled quickly. In some examples, each riser module 310 includes riser framing (not shown). Riser framing may be configured to support components of riser module 310, such as riser piping 316 and/or power infrastructure. In some examples, each manifold module 312 includes manifold framing (not shown). Manifold framing may be configured to support cooling liquid infrastructure of manifold module 312, such as manifold section piping 318, manifold unit supply piping 320, and manifold unit return piping 322; power infrastructure of manifold module 312, such as electrical wiring, electrical conduits, and/or one or more power supplies; and the like. For example, the manifold framing may be coupled to manifold piping, the riser framing, and/or one or more power supplies. In some examples, riser framing and/or manifold framing may be configured to integrate directly with a primary structure of a building housing data hall 300. For example, riser framing and/or manifold framing may be steel framing configured (e.g., sized and/or shaped) to fit and/or couple to infrastructure, such as floor, ceiling, beams, or other supports of the primary structure. In this way, each section of cooling spine 308 may be fabricated without additional building infrastructure or secondary fixings.

FIG. 9 is a conceptual diagram illustrating a side view of an example array of cooling units 314A, in accordance with one or more aspects of the present disclosure. While FIG. 9 will be described with respect to array of cooling units 314A, the principles discussed in FIG. 9 may be applied to any array of cooling units as discussed herein.

Each array of cooling units 314 includes at least one heat exchanger assembly 324 and at least one circulation assembly 326. In the example of FIG. 9, array of cooling units 314A includes six heat exchanger assemblies 324A, 324C, 324E, 324G, 324I, and 324K, and two circulation assemblies 326A and 326B above the heat exchanger assemblies 324. However, as will be illustrated in FIG. 9, an array of cooling units 314 may include different configurations of cooling units 324 and 326 within the array of cooling units 314.

In the example of FIG. 9, each heat exchanger assembly 324 includes a cooling coil assembly, illustrated with respect to heat exchanger assembly 324K. Each cooling coil assembly includes one or more cooling coils 334, a cooling liquid inlet 336A, and a cooling liquid outlet 336B. Each cooling coil assembly is configured to receive cooling liquid from cooling liquid inlet 336A, flow cooling liquid through cooling coils 334 to remove heat from return air passing by cooling coils 334, and discharge warmed cooling liquid from cooling liquid outlet 336B.

In the example of FIG. 9, each circulation assembly 326 includes a fan assembly, illustrated with respect to circulation assembly 326A. Each fan assembly includes one or more fans 338 and a power source 340. Each fan 338 of each fan assembly is configured to receive electrical power from power source 340 and discharge supply air using the electrical power. In the example of FIG. 9, each fan assembly includes three fans 338; however, in other examples, each fan assembly may include greater or fewer than three fans 338.

In some examples, each array of cooling units 314 may be configured for redundancy within the array of cooling units 314. For example, if one cooling device, such as cooling coils 334 or fans 338, fail, the remaining cooling devices of an array of cooling units 314 may continue to cool return air from an adjacent hot aisle 306 or discharge supply air into an upper volume of an adjacent data hall 302. In some examples, each array of cooling units 314 may be configured with at least 20% redundant capacity (5+1), such that each fan assembly includes at least five fans and each cooling coil assembly includes at least five cooling coils operating at a time. In the example of FIG. 9, array of cooling units 314A includes six cooling coil assemblies (5+1) and two fan assemblies, each including three fans (5+1). As such, if cooling coils of a cooling coil assembly or a fan of a fan assembly fails, the remaining cooling coils 334 of the other five operating cooling coil assemblies or the remaining five operating fans 338 of the two fan assemblies may be configured to adequately cool return air from the adjacent hot aisle 306 and discharge supply air to the adjacent cold aisle 304.

In some examples, each array of cooling units 314 may include support infrastructure to physically support cooling units 324 and 326 and infrastructure for operating cooling units 324 and 326. Array of cooling units 314 may include an array frame 342. Array frame 342 may be configured to house one or more cooling units 324 and 326 of array of cooling units 314. In some examples, cooling units 324 and 326 of each array of cooling units 314 may be removably coupled to array frame 342. For example, array frame 342 and/or each cooling units 324 and 326 may include an attachment mechanism configured to secure a respective cooling unit 324 or 326 into array frame 342. In some examples, array frame 342 and/or cooling units 324 and 326 may be configured to permit removal of cooling units 324 and 326 from array frame 342 into service aisle 309.

In some examples, each array of cooling units 314 may include a blanking panel 344. Blanking panel 344 may be configured to fit between heat exchanger assemblies 324 and circulation assemblies 326. For example, blanking panels 344 may have a width corresponding to an integer of cooling units 324 and/or 326. However, blanking panels 344 may have a height selected for a particular data hall 302, such that blanking panels 344 may fit a height of the array of cooling units 314 into the respective data hall, while permitting cooling units 324 and 326 to have a standard frame size. For example, data halls 302 may have various heights. To accommodate these heights, blanking panels 344 may fit between heat exchanger assemblies 324 and circulation assemblies 326.

The techniques described throughout may be implemented by or as any one of a method, a device and a system according to the principles of the present disclosure. In addition, the techniques described throughout may be implemented in hardware, software, firmware, or any combination thereof. Various features described as modules, units or components may be implemented together in an integrated logic device or separately as discrete but interoperable logic devices or other hardware devices. In some cases, various features of electronic circuitry may be implemented as one or more integrated circuit devices, such as an integrated circuit chip or chipset.

If implemented in hardware, this disclosure may be directed to an apparatus such as a processor or an integrated circuit device, such as an integrated circuit chip or chipset. Alternatively or additionally, if implemented in software or firmware, the techniques may be realized at least in part by a computer readable data storage medium comprising instructions that, when executed, cause a processor to perform one or more of the methods described above. For example, the computer-readable data storage medium may store such instructions for execution by a processor.

A computer-readable medium may form part of a computer program product, which may include packaging materials. A computer-readable medium may comprise a computer data storage medium such as random-access memory (RAM), read-only memory (ROM), non-volatile random-access memory (NVRAM), electrically erasable programmable read-only memory (EEPROM), Flash memory, magnetic or optical data storage media, and the like. In some examples, an article of manufacture may comprise one or more computer-readable storage media.

In some examples, the computer-readable storage media may comprise non-transitory media. The term "non-transitory" may indicate that the storage medium is not embodied in a carrier wave or a propagated signal. In certain examples, a non-transitory storage medium may store data that can, over time, change (e.g., in RAM or cache).

The code or instructions may be software and/or firmware executed by processing circuitry including one or more processors, such as one or more digital signal processors (DSPs), general purpose microprocessors, application-specific integrated circuits (ASICs), field-programmable gate arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, functionality described in this disclosure may be provided within software modules or hardware modules.

What is claimed is:

1. A system for cooling one or more data halls of a data center, comprising:
a cooling spine comprising a plurality of sections and configured to cool one or more data halls on a level of the data center, wherein each section of the plurality of sections of the cooling spine comprises:
a riser module comprising riser piping configured to fluidically couple to at least one of a liquid cooling system or a riser module of a vertically adjacent cooling spine;
a manifold module comprising manifold piping fluidically coupled to the riser piping and configured to fluidically couple to a manifold module of an adjacent section of the cooling spine;
an array of cooling units positioned toward a data hall of the one or more data halls and defining a wall of a service aisle;
wherein the array of cooling units comprises:
a heat exchanger assembly fluidically coupled to the manifold piping, the heat exchanger assembly configured to cool return air from an enclosed hot aisle adjacent a row of cabinets to the service aisle to generate supply air, and
a circulation assembly configured to discharge the supply air from the service aisle to a cold aisle adjacent the row of cabinets; and
a filtration system configured to filter at least a portion of the supply air from the service aisle.

2. The system of claim 1, wherein each heat exchanger assembly comprises a cooling coil assembly and each circulation assembly comprises a fan assembly.

3. The system of claim 2,
wherein each fan assembly comprises at least five fans; and
wherein each cooling coil assembly comprises at least five cooling coils.

4. The system of claim 1, wherein the array of cooling units comprises an upper array of cooling units and a lower array of cooling units.

5. The system of claim 1, wherein each cooling unit of the array of cooling units is removably coupled to an array frame.

6. The system of claim 5, wherein each cooling unit of the array of cooling units is configured to be removable from the array frame into the service aisle.

7. The system of claim 1,
wherein the riser module further comprises riser framing, and
wherein the manifold module further comprises manifold framing coupled to the manifold piping and the riser framing.

8. The system of claim 1, further comprising one or more power supplies coupled to the manifold framing.

9. The system of claim 1, wherein the riser piping is vertical and the manifold piping is horizontal.

10. The system of claim 1, wherein the manifold piping is further configured to couple to manifold piping of one or more horizontally adjacent manifold modules.

11. The system of claim 1, wherein the riser piping is configured to couple to riser piping of one or more vertically adjacent manifold modules.

12. The system of claim 1, further comprising a data hall firewall module located in the data hall and positioned perpendicular to the array of cooling units to divide the data hall into at least two independent fire zones.

13. The system of claim 12, wherein the one or more cold aisles are connected.

14. The system of claim 1,
wherein the data hall is a first data hall on a first side of the cooling spine,
wherein the data center comprises a second data hall on a second side of the cooling spine, the second side opposite the first side, and
wherein the array of cooling units comprises:
a first array of cooling units positioned on a first side of the manifold module toward the first data hall; and
a second array of cooling units positioned on a second side of the manifold module toward the second data hall.

15. The system of claim 14, further comprising a spine firewall module positioned between the first and second arrays of cooling units.

16. The system of claim 14,
wherein the riser module and the manifold module are positioned in the service aisle between the first and second arrays of cooling units,
wherein the service aisle is bounded by the first and second arrays of cooling units,
wherein the first array of cooling units is configured to cool first heated air from a hot aisle of the first data hall to generate first cooled air and discharge the first cooled air from the service aisle into a cold aisle of the first data hall, and
wherein the second array of cooling units is configured to cool second heated air from a hot aisle of the second data hall to generate second cooled air and discharge the second cooled air from the service aisle into a cold aisle of the second data hall.

17. The system of claim 16, wherein the service aisle creates a uniform pressure zone for the first and second arrays of cooling units to discharge the first and second cooled air the service aisle into the cold aisles of the first and second data halls.

18. The system of claim 1, wherein the circulation assembly is configured to discharge the supply air to the cold aisle via an upper volume of the data hall.

19. The system of claim 1, further comprising a data hall adjacent to the cooling spine, wherein the data hall adjacent to the cooling spine comprises:
one or more cold aisles; and
one or more hot aisles separated from an adjacent cold aisle by an adjacent row of cabinets and one or more walls or barriers.

20. A system for cooling a data center having a plurality of data halls, comprising:
a central cooling spine positioned between a first one or more data halls of the plurality of data halls located on a first side of the central cooling spine and a second one or more data halls of the plurality of data halls located on a second side of the central cooling spine, the central cooling spine comprising:
a first plurality of arrays of cooling units positioned on the first side of the central cooling spine, each of the first plurality of arrays of cooling units configured to cool a row of cabinets in a data hall of the first one or more data halls on the first side;
a second plurality of arrays of cooling units positioned on the second side of the central cooling spine, opposite the first side, each of the second plurality of arrays of cooling units configured to cool a row of cabinets in a data hall of the second one or more data halls on the second side, a plurality of riser modules positioned vertically within the central cooling spine, each riser module comprising riser piping configured to fluidically couple to a liquid cooling system; and a plurality of manifold modules positioned horizontally along the central cooling spine, each manifold module comprising manifold piping fluidically coupled to the riser piping of a corresponding riser module and at least one cooling unit of the first and second pluralities of arrays of cooling units.

21. The system of claim 20, further comprising a service aisle bounded by the first and second pluralities of arrays of cooling units.

22. The system of claim 21, further comprising a filtration system configured to filter air from the service aisle.

23. The system of claim 21, wherein each of the one or more data halls further comprises a data hall floor, and wherein the service aisle comprises a service aisle floor for the service aisle that is lower than a corresponding data hall floor.

24. The system of claim 20, wherein the plurality of riser modules and manifold modules are configured to create one or more temperature zones between a first data hall and a second data hall.

25. The system of claim 20, wherein the central cooling spine creates a uniform pressure zone to supply the first and second arrays of cooling units with air.

26. The system of claim 20, wherein each data hall of the plurality of data halls further comprises an upper volume of the data hall configured to receive cooled supply air from the central cooling spine and discharge the cooled supply air into one or more cold aisles adjacent the cabinets of the plurality of data halls.

27. A data center, comprising:
one or more vertically arranged levels of a plurality of data halls;
a system for cooling the plurality of data halls that includes a central cooling spine positioned between a first one or more data halls of the plurality of data halls located on a first side of the central cooling spine and a second one or more data halls of the plurality of data halls located on a second side of the central cooling spine, the central cooling spine comprising:
a first plurality of arrays of cooling units positioned on the first side of the central cooling spine, each of the first plurality of arrays of cooling units configured to cool a row of cabinets in a data hall of the first one or more data halls on the first side;
a second plurality of arrays of cooling units positioned on the second side of the central cooling spine, opposite the first side, each of the second plurality of arrays of cooling units configured to cool a row of cabinets in a data hall of the second one or more data halls on the second side,
a plurality of riser modules positioned vertically within the central cooling spine, each riser module comprising riser piping configured to fluidically couple to a liquid cooling system; and
a plurality of manifold modules positioned horizontally along the central cooling spine, each manifold module comprising manifold piping fluidically coupled to the riser piping of a corresponding riser module and at least one cooling unit of the first and second pluralities of arrays of cooling units.

* * * * *